(12) United States Patent
Kim et al.

(10) Patent No.: US 9,484,500 B2
(45) Date of Patent: Nov. 1, 2016

(54) SEMICONDUCTOR LIGHT EMITTING DEVICE AND METHOD OF MANUFACTURING THE SAME

(71) Applicant: SAMSUNG ELECTRONICS CO., LTD., Suwon-si (KR)

(72) Inventors: Ki Seok Kim, Hwaseong-si (KR); Sang Seok Lee, Seoul (KR); Su Yeol Lee, Seongnam-si (KR); Chan Mook Lim, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 14/300,642

(22) Filed: Jun. 10, 2014

(65) Prior Publication Data

US 2014/0367720 A1    Dec. 18, 2014

(30) Foreign Application Priority Data

Jun. 17, 2013  (KR) .................. 10-2013-0069192

(51) Int. Cl.
| | |
|---|---|
| *H01L 33/00* | (2010.01) |
| *H01L 31/12* | (2006.01) |
| *H01L 33/42* | (2010.01) |
| *H01L 33/40* | (2010.01) |
| *H01L 33/46* | (2010.01) |
| *H01L 33/38* | (2010.01) |

(52) U.S. Cl.
CPC .............. *H01L 33/42* (2013.01); *H01L 33/38* (2013.01); *H01L 33/405* (2013.01); *H01L 33/46* (2013.01)

(58) Field of Classification Search
CPC ...... H01L 33/38; H01L 33/405; H01L 33/42
See application file for complete search history.

(56) References Cited

U.S. PATENT DOCUMENTS 5,309,001 A * 5/1994 Watanabe ............. H01L 33/385
                                                           257/778
6,372,608 B1    4/2002 Shimoda et al.
(Continued)

FOREIGN PATENT DOCUMENTS

JP    2008-192690 A    8/2008
JP    2009-43934 A     2/2009
(Continued)

*Primary Examiner* — Mark Tornow
*Assistant Examiner* — Priya Rampersaud
(74) *Attorney, Agent, or Firm* — Sughrue Mion, PLLC

(57) ABSTRACT

A semiconductor light emitting device and method of manufacturing the semiconductor light emitting device are provided. The semiconductor light emitting device includes a light emitting structure including a first conductivity type semiconductor layer, an active layer, and a second conductivity type semiconductor layer. The device may also includes a first electrode connected to the first conductivity type semiconductor layer, and a second electrode connected to the second conductivity type semiconductor layer and having a pad region and a finger region extended from the pad region in one direction. The second electrode may include a transparent electrode part positioned on the second conductivity type semiconductor layer and including at least one opening therein, at least one reflective part spaced apart from the transparent electrode part within the opening and disposed in the pad region and the finger region, and a bonding part positioned on at least one portion of the reflective part and including a plurality of bonding finger parts spaced apart from each other in the finger region and a bonding pad part disposed in the pad region.

12 Claims, 15 Drawing Sheets

(56) References Cited

U.S. PATENT DOCUMENTS

| | | |
|---|---|---|
| 6,645,830 B2 | 11/2003 | Shimoda et al. |
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong et al. |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,227,823 B2 * | 7/2012 | Bae ............... H01L 33/14 257/100 |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,618,551 B2 * | 12/2013 | Nishikawa ............... H01L 33/14 257/198 |
| 8,680,559 B2 * | 3/2014 | Kim ............... H01L 33/38 257/98 |
| 2009/0039374 A1 | 2/2009 | Yahata et al. |
| 2010/0072487 A1 * | 3/2010 | Tsai ............... H01L 33/14 257/86 |
| 2011/0089401 A1 * | 4/2011 | Hiraiwa ............... H01L 33/38 257/13 |
| 2011/0114990 A1 * | 5/2011 | Kim ............... H01L 33/38 257/99 |
| 2011/0198641 A1 | 8/2011 | Yahata et al. |
| 2011/0284908 A1 * | 11/2011 | Muramoto ............... H01L 33/38 257/98 |
| 2012/0098009 A1 * | 4/2012 | Kim ............... H01L 33/38 257/98 |
| 2012/0223357 A1 | 9/2012 | Jeon |
| 2012/0267672 A1 | 10/2012 | Jeon |
| 2013/0146929 A1 * | 6/2013 | Kim ............... H01L 33/46 257/98 |
| 2013/0234170 A1 | 9/2013 | Lim et al. |
| 2013/0234192 A1 | 9/2013 | Kim et al. |
| 2014/0070252 A1 * | 3/2014 | Lee ............... H01L 33/42 257/98 |

FOREIGN PATENT DOCUMENTS

| | | |
|---|---|---|
| JP | 2011-192960 A | 9/2011 |
| KR | 10-2010-0012003 A | 2/2010 |
| KR | 10-2011-0083292 A | 7/2011 |
| KR | 10-2011-0095177 A | 8/2011 |
| KR | 10-1131084 B1 | 3/2012 |
| KR | 10-2012-0053990 A | 5/2012 |
| KR | 10-2012-0064494 A | 6/2012 |
| KR | 10-1169036 B1 | 7/2012 |
| KR | 10-1223226 B1 | 1/2013 |

* cited by examiner

SEMICONDUCTOR LIGHT EMITTING DEVICE AND METHOD OF MANUFACTURING THE SAME

CROSS-REFERENCE TO RELATED APPLICATIONS

This application claims priority from Korean Patent Application No. 10-2013-0069192, filed on Jun. 17, 2013, with the Korean Intellectual Property Office, the disclosure of which is incorporated herein by reference.

BACKGROUND

1. Technical Field

Devices and methods consistent with exemplary embodiments relate to a semiconductor light emitting device and method of manufacturing the same.

2. Description of the Related Art

A semiconductor light emitting device is a semiconductor device capable of emitting light of various colors due to the recombination of electrons and electron holes at a bonding portion between p-type and n-type semiconductor layers thereof when current is applied thereto. The semiconductor light emitting device has various advantages, such as a relatively long lifespan, low power consumption, superior initial driving characteristics, and high vibration resistance, as compared with a filament-based light emitting device. Accordingly, demand semiconductor light emitting devices has been continuously increasing. In particular, a group III nitride semiconductor capable of emitting blue light in a single wavelength region has recently come to prominence.

A light emitting device using such a group III nitride semiconductor is obtained by growing a light emitting structure including n-type and p-type nitride semiconductor layers and an active layer formed therebetween, on a substrate. In this case, electrodes may be formed on a surface of the light emitting structure in order to apply an external electrical signal to the structure. As demand for high power and high efficiency semiconductor light emitting devices is increasing, electrode structures capable of preventing degradations in light reflectance and significantly reducing current concentration are in demand.

SUMMARY

Exemplary embodiments provide a semiconductor light emitting devices having improved luminance by significantly reducing light absorption and efficiently distributing current, and methods of manufacturing the same.

According to an aspect of an exemplary embodiment, there is provided semiconductor light emitting device including: a light emitting structure including a first conductivity type semiconductor layer, an active layer disposed on the first conductivity type semiconductor layer, and a second conductivity type semiconductor layer disposed on the active layer; a first electrode disposed on the first conductivity type semiconductor layer; and a second electrode having a pad region and a finger region extending from the pad region, wherein the second electrode includes: a transparent electrode part disposed on the second conductivity type semiconductor layer and having an opening provided in the pad region and the finger region; a reflective part disposed on the second conductivity type semiconductor layer in the opening of the transparent electrode part in the pad region and the finger region, and spaced apart from the transparent electrode part within the opening; and a bonding part including a plurality of bonding finger parts disposed on the reflective part in the finger region and spaced apart from each other, and a bonding pad part disposed on the reflective part in the pad region.

The bonding pad part may cover the opening of the transparent electrode part in the pad region and extend onto the transparent electrode part.

The bonding pad part may be interposed between the transparent electrode part and the reflective part within the opening of the transparent electrode part in the pad region.

The plurality of bonding finger parts may extend across the opening of the transparent electrode part in the finger region and onto the transparent electrode part.

The plurality of bonding finger parts may be interposed between the transparent electrode part and the reflective part within the opening in the finger region.

Each bonding finger part of the plurality of bonding finger parts may be spaced apart from an adjacent bonding finger part of the plurality of bonding finger parts by a predetermined distance.

The bonding part may further include a connection part that extends from the bonding pad part and connects the bonding finger parts.

The bonding finger parts may have a first width in a first direction in which the finger region is extended from the pad region, and a second width in a second direction perpendicular to the first direction, and wherein the second width is greater than the first width.

The bonding pad part may have an area that is greater than an area of each of the bonding finger parts, and have a circular shape having a third width that is greater than the second width of the bonding finger parts.

The semiconductor light emitting device may further include a current blocking layer interposed between the reflective part and the second conductivity type semiconductor layer within the opening in the pad region.

The first electrode may include a first reflective part disposed on the first conductivity type semiconductor layer; and a first bonding part disposed on the first reflective part.

The first electrode may have a first pad region and a first finger region extending from the first pad region, and the first electrode may include a first reflective part disposed on the first conductivity type semiconductor layer, the first reflective part including a reflective pad part provided in the first pad region and a plurality of reflective finger parts provided in the first finger region and spaced apart from each other; and a first bonding part disposed on the first reflective part in the first pad region and the first finger region.

The first bonding part may be disposed on the first conductivity type semiconductor layer between the plurality of reflective finger parts.

The semiconductor light emitting device may further include a light diffusion layer disposed on the first conductivity type semiconductor layer and exposing portions the first conductivity type semiconductor layer, wherein the first electrode includes a first reflective part disposed on the light diffusion layer and the exposed portions of the first conductivity type semiconductor layer; and a first bonding part disposed on the first reflective part.

The first electrode may have a first pad region and a plurality of first finger regions extending from the first pad region, wherein the finger region of the second electrode may include a plurality of second finger regions extending from the pad region of the second electrode, and the first finger regions of the first electrode and the second finger regions of the second electrode may be alternately disposed to form a current spreading net.

BRIEF DESCRIPTION OF THE DRAWINGS

The above and other aspects will be more clearly understood from the following detailed description taken in conjunction with the accompanying drawings, in which.

DETAILED DESCRIPTION

Figure 1:
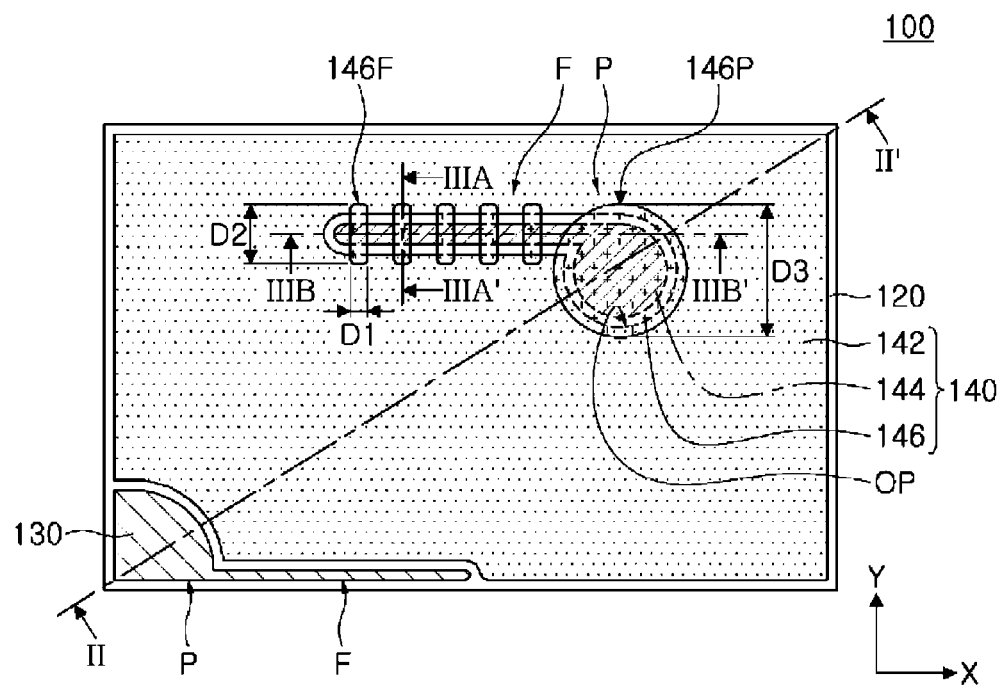
FIG. 1 is a schematic plan view of a semiconductor light emitting device according to an exemplary embodiment.

Hereinafter, exemplary embodiments will be described in detail with reference to the accompanying drawings. The inventive concept of the present application may, however, be embodied in many different forms and should not be construed as being limited to the exemplary embodiments set forth herein. Rather, these exemplary embodiments are provided so that this disclosure will be thorough and complete, and will fully convey the scope of the inventive concept to those skilled in the art. In the drawings, the shapes and dimensions of elements may be exaggerated for clarity, and the same reference numerals will be used throughout to designate the same or like elements.

Figure 2:
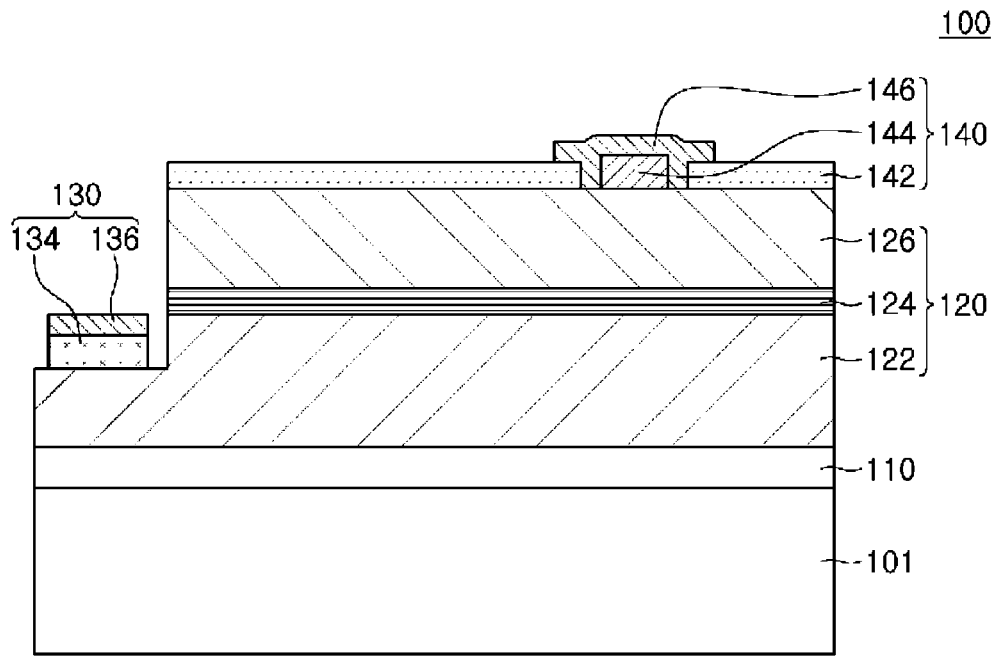
FIG. 2 is a schematic cross-sectional view of the semiconductor light emitting device of FIG. 1, taken along line II-II'.
Figure 3:
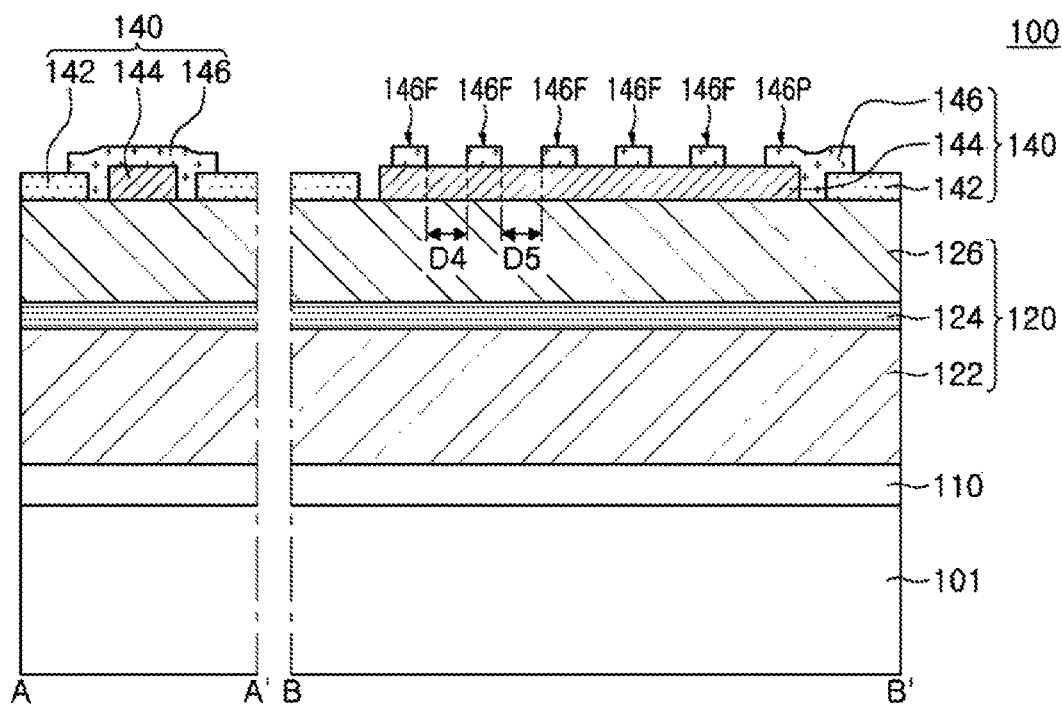
FIG. 3 is a schematic cross-sectional view of the semiconductor light emitting device of FIG. 1, taken along line IIIA-IIIA' and line IIIB-IIIB'.

FIG. 1 is a schematic plan view of a semiconductor light emitting device according to an exemplary embodiment. FIG. 2 is a schematic cross-sectional view of the semiconductor light emitting device of FIG. 1, taken along line II-II'. FIG. 3 is a schematic cross-sectional view of the semiconductor light emitting device of FIG. 1, taken along line IIIA-IIIA' and line IIIB-IIIB'.

Referring to FIGS. 1 through 3, a semiconductor light emitting device 100 may include a substrate 101, a buffer layer 110 disposed on the substrate 101, and a light emitting structure 120 disposed on the buffer layer 110. The light emitting structure 120 may include a first conductivity type semiconductor layer 122, an active layer 124, and a second conductivity type semiconductor layer 126. In addition, the semiconductor light emitting device 100 may include first and second electrodes 130 and 140 as electrode structures. The first electrode 130 may include a first reflective part 134 and a first bonding part 136. The second electrode 140 may include a transparent electrode part 142, a second reflective part 144, and a second bonding part 146.

As used herein, the terms 'above', 'upper portion', 'upper surface', 'below' 'lower portion', 'lower surface', 'side surface', and the like, are used based on the drawings, and may actually be different depending on a direction in which the device or a package is actually disposed.

The substrate 101 may be provided as a substrate for semiconductor growth. The substrate 101 may be formed of an insulating material, a conductive material, or a semiconductor material such as sapphire, SiC, $MgAl_2O_4$, MgO, $LiAlO_2$, $LiGaO_2$, GaN or the like. Sapphire widely used as a nitride semiconductor growth substrate, may be a crystal having electrical insulating properties and Hexa-Rhombo R3c symmetry. The sapphire may have a lattice constant of 13.001 Å in a C-axis direction and a lattice constant of 4.758 Å in an A-axis direction and may include a C (0001) plane, an A (1120) plane, an R (1102) plane, and the like. In this case, the C plane is mainly used as a nitride growth substrate because the C plane relatively facilitates the growth of a nitride film and is stable at high temperatures. A plurality of uneven structures may be formed on an upper surface of the substrate 101, that is, a growth surface of the semiconductor layers. Due to the uneven structures, crystalline properties, light emission efficiency and the like, of the semiconductor layers may be improved.

However, according to various exemplary embodiments, the substrate 101 may serve as an electrode of the semiconductor light emitting device 100, together with the first electrode 130, and in this case, the substrate 101 may be formed of a conductive material. Therefore, the substrate 101 may be formed of a material including one of gold (Au), nickel (Ni), aluminum (Al), copper (Cu), tungsten (W), silicon (Si), selenium (Se), germanium (Ge), gallium nitride (GaN) and gallium arsenide (GaAs), for example, a silicon (Si) material doped with aluminum (Al).

The buffer layer 110 is provided to alleviate lattice defects in the light emitting structure 120 grown on the substrate 101 and may be formed of an undoped semiconductor layer including a nitride and the like. The buffer layer 110 may alleviate a difference in lattice constants between the substrate 101 formed of, for example, sapphire and the first conductivity type semiconductor layer 122 stacked on the upper surface of the substrate 101 and formed of GaN to thereby enhance crystalline properties of the GaN layer. The buffer layer 110 may be formed using undoped GaN, AlN, and InGaN, and the like and may be grown to have a thickness of several tens through several hundreds of angstrom at low temperatures of 500° C. to 600° C. Here, the term "undoped" indicates that a separate impurity doping process has not been performed on the semiconductor layer, and an impurity concentration inherently present in the semiconductor layer, for example, in a case in which a gallium nitride semiconductor is grown using metal organic chemical vapor deposition (MOCVD), silicon (Si) or the like, used as a dopant may be included in an amount of about 1014 to 1018/cm$^3$. However, in the exemplary embodiment, the buffer layer 110 is not an essential element and thus, may be omitted according to exemplary embodiments.

The light emitting structure 120 may include the first conductivity type semiconductor layer 122, the active layer 124, and the second conductivity type semiconductor layer 126, sequentially disposed on the substrate 101. The first and second conductivity type semiconductor layers 122 and 126 may be an n-type semiconductor layer and a p-type semiconductor layer, respectively. However, the exemplary embodiments are not limited thereto and the first and second conductivity type semiconductor layers 122 and 126 may be a p-type semiconductor layer and an n-type semiconductor layer, respectively. The first and second conductivity type semiconductor layers 122 and 126 may be formed of a nitride semiconductor, for example, a material having a composition of Al$_x$In$_y$Ga1-x-yN (0≤x≤1, 0≤y≤1, 0≤x+y≤1). The first and second conductivity type semiconductor layers 122 and 126 may be formed using an AlGaInP-based or an AlGaAs-based semiconductor, in addition to the nitride semiconductor.

The active layer 124 may be interposed between the first and second conductivity type semiconductor layers 122 and 126 and emit light having a predetermined degree of energy due to the recombination of electrons and holes. The active layer 124 may include a material having an energy band gap smaller than energy band gaps of the first and second conductivity type semiconductor layers 122 and 126. For example, when the first and second conductivity type semiconductor layers 122 and 126 are formed of a GaN-based compound semiconductor, the active layer 124 may include an InAlGaN-based compound semiconductor having an energy band gap smaller than that of GaN. In addition, the active layer 124 may have a multiple quantum well (MQW) structure in which quantum barrier and quantum well layers are alternately stacked, for example, an InGaN/GaN structure.

The first and second electrodes 130 and 140 layers are provided for external electrical connection of the first and second conductivity type semiconductor layers 122 and 126, may be connected to the first and second conductivity type semiconductor layers 122 and 126, respectively. The first and second electrodes 130 and 140 may be disposed in the same direction, based on the substrate 101.

The first electrode 130 may be disposed on an upper surface of the first conductivity type semiconductor layer 122, such that the first electrode 130 is exposed through a mesa-etched region of the light emitting structure 110. The second electrode 140 may be disposed on the second conductivity type semiconductor layer 126. The first electrode 130 may include the first reflective part 134 and the first bonding part 136, and the second electrode 140 may include the transparent electrode part 142, the second reflective part 144, and the second bonding part 146.

The first electrode 130, and the second reflective part 144 and the second bonding part 146 of the second electrode 140 may respectively include pad regions P and finger regions F extended from the pad regions P and having widths narrower than those of the pad regions P, in order to enable current to be uniformly injected into the entirety of the light emitting structure 120.

The first electrode 130 may be disposed along an edge region of the light emitting structure 120 on the exposed upper surface of the first conductivity type semiconductor layer 122, in order to further efficiently disperse current.

In the first electrode 130, the first reflective part 134 may serve to prevent light emitted from the active layer 124 from being absorbed in an electrode region thereof, and may be formed of a single layer or multiple layers of a conductive material having ohmic-characteristics with the first conductivity type semiconductor layer 122. For example, the first reflective part 134 may include one of Ag, Al, Rh and Ir and may be an alloy of at least one selected from a group consisting of Mg, Zn, Sc, Hf, Zr, Te, Se, Ta, W, Nb, Cu, Si, Ni, Co, Mo, Cr, Mn, Hg, Pr and La, and Ag or Al.

The first bonding part 136 may be a region of the first electrode 130 contacting a conductive wire, a solder bump, or the like, and may include at least one of Au, W, Pt, Si, Ir, Ag, Cu, Ni, Ti, Cr and the like, and alloys thereof, but may include a material different from that of the first reflective part 134.

The transparent electrode part 142 of the second electrode 140 may have an opening OP formed therein. The second reflective part 144 is disposed within the opening OP of the transparent electrode part 142 and spaced apart from the transparent electrode part 142 by a predetermined distance. The second bonding part 146 extends from a portion of the second reflective part 144 to a portion of the transparent electrode part 142 adjacent to the second reflective part 144.

The opening OP of the transparent electrode part 142 may have a shape in which the opening OP is continuous in the pad region P and the finger region F of the second electrode 140. The transparent electrode part 142 may be formed of a transparent conductive oxide layer having a high level of light transmittance and relatively excellent ohmic-contact performance, and may be formed of at least one selected from a group consisting of indium tin oxide (ITO), zinc-doped indium tin oxide (ZITO), zinc indium oxide (ZIO), gallium indium oxide (GIO), zinc tin oxide (ZTO), fluorine-doped tin oxide (FTO), aluminum-doped zinc oxide (AZO), gallium-doped zinc oxide (GZO), In4Sn3O12 and Zn1-xMgxO (Zinc Magnesium Oxide, 0≤x≤1).

The second reflective part 144 may be disposed within the opening OP and have a shape in which the second reflective part 144 is continuous in the pad region P and the finger region F of the second electrode 140. The second reflective part 144 may be spaced apart from the transparent electrode part 142 by a predetermined distance. In a case in which the second reflective part 144 is formed to contact the transparent electrode part 142, an interface compound may be generated in a junction interface therebetween to increase driving voltage and light absorption may be caused due to the interface compound to degrade luminance. In a case in which the second reflective part 144 is spaced relatively far apart from the transparent electrode part 142, the second reflective part 144 may have a small area to deteriorate reflectance. Therefore, the second reflective part 144 may be spaced apart from the transparent electrode part 142 by a distance ranging, for example, from about 3 µm to about 6 µm. The second reflective part 144 may be formed of the same material as that of the first reflective part 134.

In FIGS. 2 and 3, although the second reflective part 144 is illustrated as having a thickness greater than that of the transparent electrode part 142, the thickness of the second reflective part 144 is not limited thereto, and may be smaller than or the same as that of the transparent electrode part 142 according to exemplary embodiments.

The second bonding part 146 may include a bonding pad part 146P and a plurality of bonding finger parts 146F. The second bonding part 146 may be formed of the same material as that of the first bonding part 136, and may include a different material from that of the second reflective part 144.

Referring to FIG. 2, the bonding pad part 146P may be extended onto the transparent electrode part 142 while covering the second reflective part 144 in the pad region P and filling a clearance between the second reflective part 144 and the transparent electrode part 142. The plurality of bonding finger parts 146F may be arranged in a line while being spaced apart from each other by predetermined distances, in the finger region F. The number of the bonding finger parts 146F is not limited to the exemplary embodiment illustrated in the drawings and may be varied according to exemplary embodiments. Referring to FIG. 3, the bonding finger parts 146F may also be extended onto the transparent electrode part 142 while covering the second reflective part 144 and filling a clearance between the second reflective part 144 and the transparent electrode part 142. Although a case in which the bonding pad part 146P and the bonding finger parts 146F have the same height is illustrated in FIG. 3, the bonding pad part 146P may have a relatively large height according to exemplary embodiments.

Each of the bonding finger parts 146F may have a first width D1 in a first direction in which the finger region F is extended from the pad region P, for example, in an X-direction and may have a second width D2 in a second direction perpendicular to the first direction, for example, in an Y-direction, the second width D2 being greater than the first width D1. A shape of the bonding finger part 146F is not limited to the exemplary embodiment illustrated in FIG. 1 and may be variously changed to a shape such as a rectangle or an oval. The bonding pad part 146P may be formed to have an area greater than that of the bonding finger part 146F and as illustrated in FIG. 1, have a circular shape having a third width D3 greater than the second width D2. Each of the plurality of bonding finger parts 146F may be spaced apart from the bonding finger parts 146F adjacent thereto by a distance D4 and a distance D5. According to exemplary embodiments, the distance D4 and the distance D5 may be the same as or may be different from each other.

The semiconductor light emitting device 100 according to the exemplary embodiment may include the second reflective part 144 extended to the finger region F and the plurality of bonding finger parts 146F having relatively small areas, to significantly increase light extraction efficiency. In addition, an external electrical signal applied to the bonding pad part 146P may be transmitted to the bonding finger parts 146F in the finger region F through the second reflective part 144 and arrives at the transparent electrode part 142 to thereby significantly reduce the concentration of current, such that current spreading may be efficiently performed regardless of a length of the finger region F.

Although the exemplary embodiment exemplifies the semiconductor light emitting device 100 having a horizontal type structure, in which a portion of the first conductivity type semiconductor layer 122 is exposed, the exemplary embodiment is not limited thereto and a semiconductor light emitting device having a vertical type structure may also be used.

Figure 4:
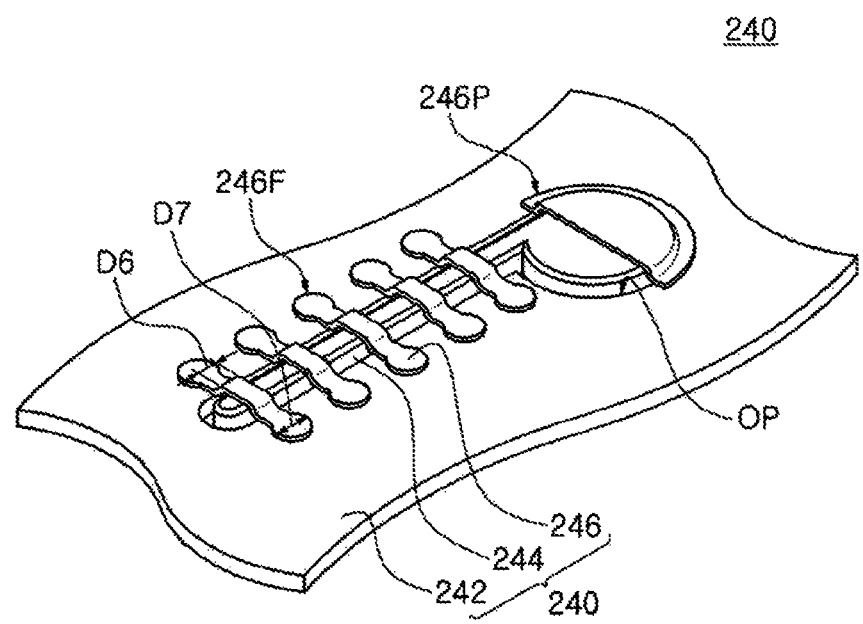
FIG. 4 is a partially cut-away perspective view illustrating another example of a second electrode of the semiconductor light emitting device according to the exemplary embodiment.

FIG. 4 is a partially cut-away perspective view illustrating an example of a second electrode of the semiconductor light emitting device according to the exemplary embodiment. FIG. 4 merely illustrates a portion corresponding to the second electrode 140 in the semiconductor light emitting device 100 of FIGS. 1 through 3 and shows a partially cut-way view of a bonding pad part 246P for the convenience of comprehension.

Referring to FIG. 4, the second electrode 240 may include a transparent electrode part 242 having the opening OP formed therein, a second reflective part 244 spaced apart from the transparent electrode part 242 by a predetermined distance and disposed within the opening OP, and a second bonding part 246 extended from a portion of the second reflective part 244 to a portion of the transparent electrode part 242 adjacent to the second reflective part 244. The second bonding part 246 may include a bonding pad part 246P and a plurality of bonding finger parts 246F.

In the exemplary embodiment of FIG. 4, each of the bonding finger parts 246F may have a dumbbell shape in which a width D7 thereof on the transparent electrode part 242 is greater than a width D6 thereof on the second reflective part 244. According to exemplary embodiments, the bonding finger part 246F may have a width gradually increasing from the second reflective part 244 to the transparent electrode part 242. Thus, a contact area between the transparent electrode part 242 and the bonding finger part 246F may be increased, such that current spreading may be further efficiently performed.

Figure 5:
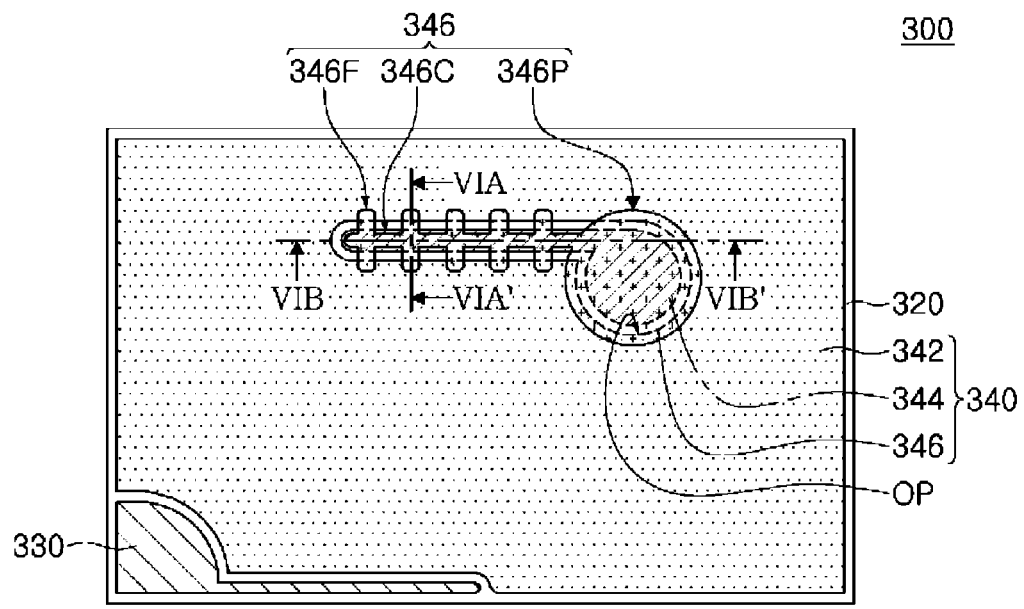
FIG. 5 is a schematic plan view of a semiconductor light emitting device according to an exemplary embodiment.
Figure 6:
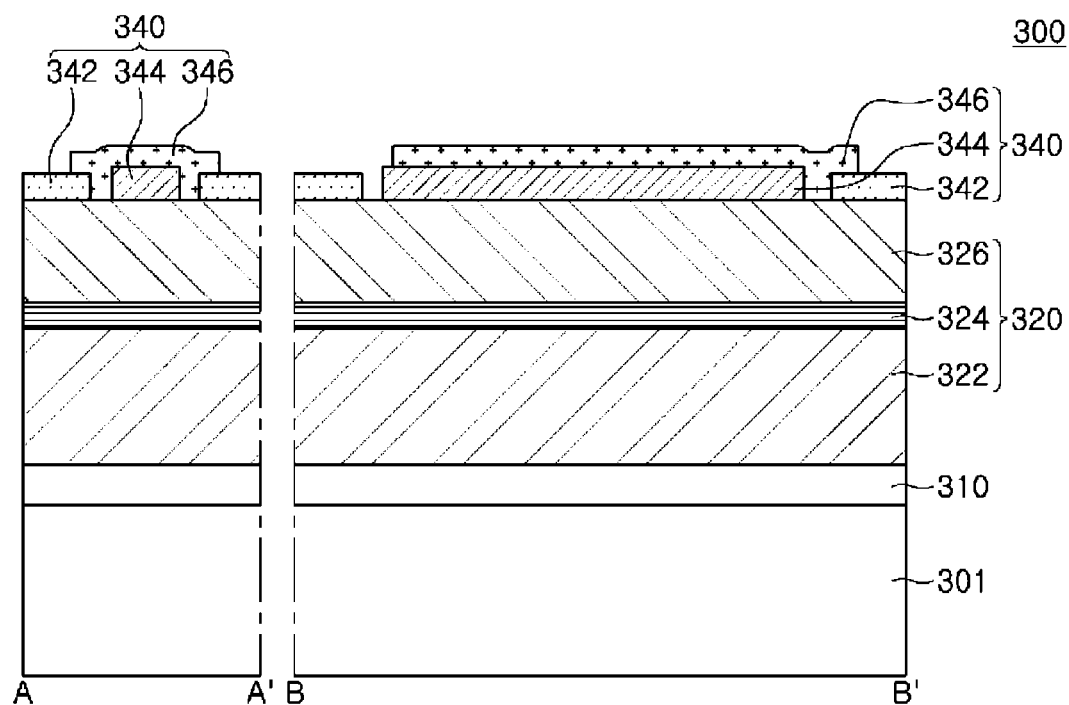
FIG. 6 is a schematic cross-sectional view of the semiconductor light emitting device of FIG. 5, taken along line VIA-VIA' and line VIB-VIB'.

FIG. 5 is a schematic plan view of a semiconductor light emitting device according to an exemplary embodiment. FIG. 6 is a schematic cross-sectional view of the semiconductor light emitting device of FIG. 5, taken along line VIA-VIA' and line VIB-VIB'.

Referring to FIGS. 5 and 6, a semiconductor light emitting device 300 may include a buffer layer 310 disposed on a substrate 301, a light emitting structure 320 disposed on the buffer layer 310. The light emitting structure 320 may include a first conductivity type semiconductor layer 322, an active layer 324, and a second conductivity type semiconductor layer 326. In addition, the semiconductor light emitting device 300 may include first and second electrodes 330 and 340 as electrode structures. The second electrode 340 may include a transparent electrode part 342, a second reflective part 344, and a second bonding part 346.

The second electrode 340 may include the transparent electrode part 342 having the opening OP formed therein, the second reflective part 344 spaced apart from the transparent electrode part 342 by a predetermined distance and disposed within the opening OP, and the second bonding part 346 extended from a portion of the second reflective part 344 to a portion of the transparent electrode part 342 adjacent to the second reflective part 344.

In the exemplary embodiment of FIGS. 5 and 6, the second bonding part 346 may include a bonding pad part 346P, a plurality of bonding finger parts 346F and a connection part 346C. The connection part 346C may connect the bonding pad part 346P and the plurality of bonding finger parts 346F and may be disposed to pass through central portions of the bonding finger parts 346F from an end of the bonding pad part 346P. A width of the connection part 346C may be the same as or smaller than that of the second reflective part 344 disposed below the connection part 346C.

Figure 7:
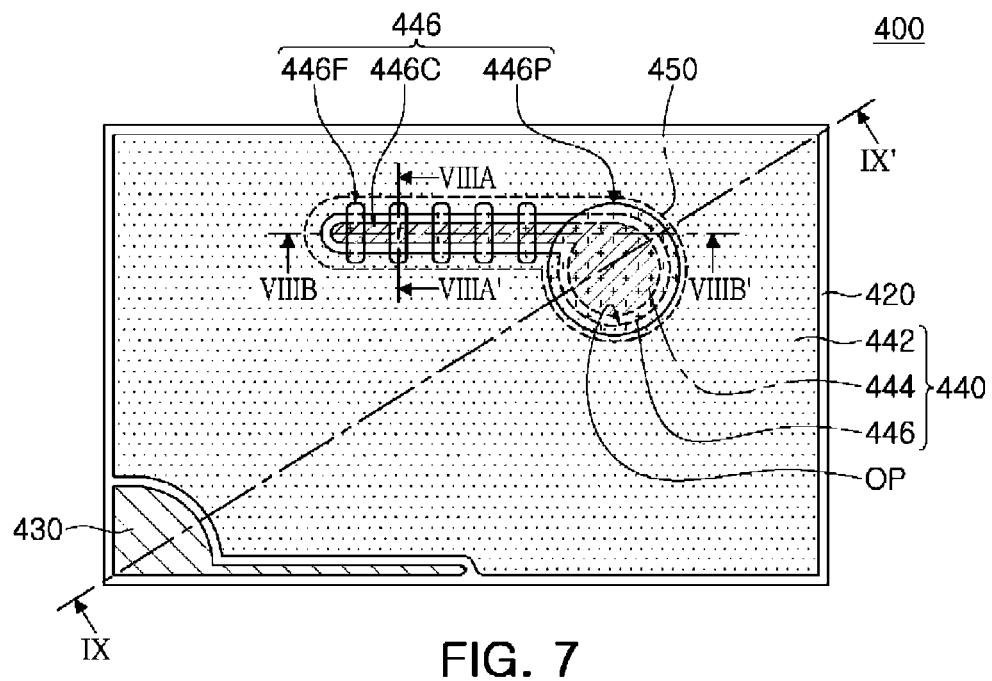
FIG. 7 is a schematic plan view of a semiconductor light emitting device according to an exemplary embodiment.
Figure 8:
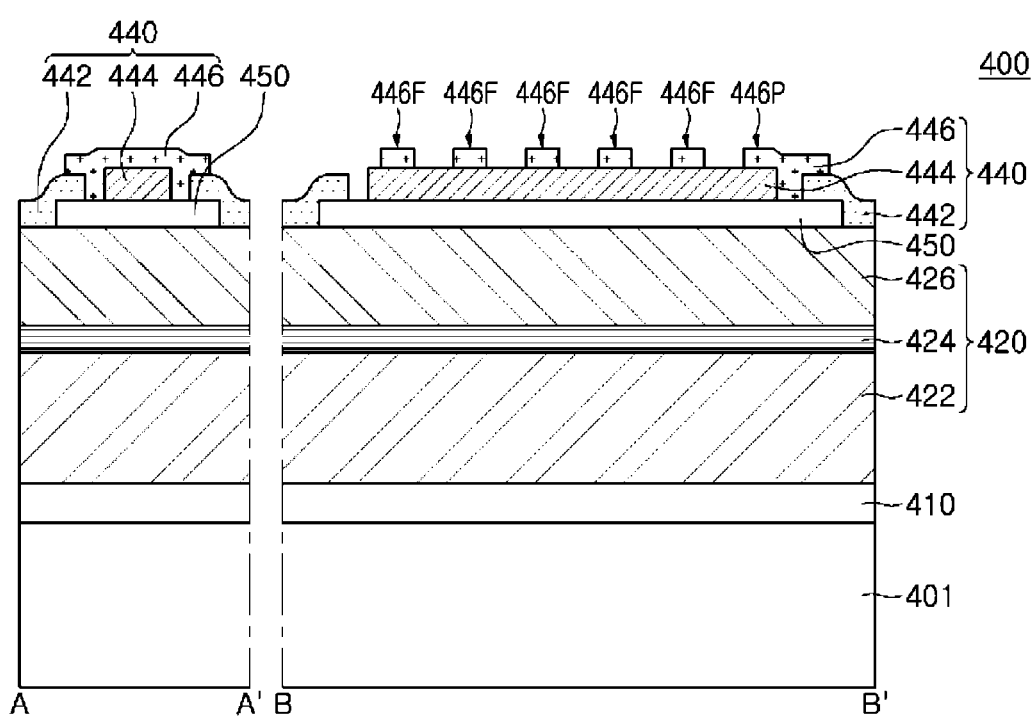
FIG. 8 is a schematic cross-sectional view of the semiconductor light emitting device of FIG. 7, taken along line VIIIA-VIIIA' and line VIIIB-VIIIB'.

FIG. 7 is a schematic plan view of a semiconductor light emitting device according to an exemplary embodiment. FIG. 8 is a schematic cross-sectional view of the semiconductor light emitting device of FIG. 7, taken along line VIIIA-VIIIA' and line VIIIB-VIIIB'.

Referring to FIGS. 7 and 8, a semiconductor light emitting device 400 may include a buffer layer 410, a light emitting structure 420, and a current blocking layer 450 disposed on a substrate 401, and the light emitting structure 420 may include a first conductivity type semiconductor layer 422, an active layer 424, and a second conductivity type semiconductor layer 426. In addition, the semiconductor light emitting device 400 may include first and second electrodes 430 and 440 as electrode structures. The second electrode 440 may include a transparent electrode part 442, a second reflective part 444, and a second bonding part 446.

The current blocking layer 450 may be disposed on the second conductivity type semiconductor layer 426 but may be disposed below the opening OP in the transparent electrode part 442, while having a similar shape to that of the opening OP but an enlarged size, as compared thereto. Thus, the transparent electrode part 442 may be formed on an edge of the current blocking layer 450. The current blocking layer 450 may include an insulating material and for example, may include one of $SiO_2$, SiN, $Al_2O_3$, HfO, $TiO_2$ and ZrO.

An electrical signal applied to the second bonding part 446, for example, current may be easily dispersed in the entirety of the light emitting structure 420 through the transparent electrode part 442, without being restricted to a lower portion of the second bonding part 446 due to the current blocking layer 450.

FIGS. 9A through 9F are cross-sectional views illustrating respective main processes in a method of manufacturing a semiconductor light emitting device according to an exemplary embodiment. Specifically, FIGS. 9A through 9F are cross-sectional views of the semiconductor light emitting device above described with reference to FIGS. 7 and 8, taken along line IX-IX' of FIG. 7. However, the semiconductor light emitting devices of FIGS. 1 to 6 may also be manufactured in a similar manner as that of FIGS. 7 and 8.

Figure 9A:
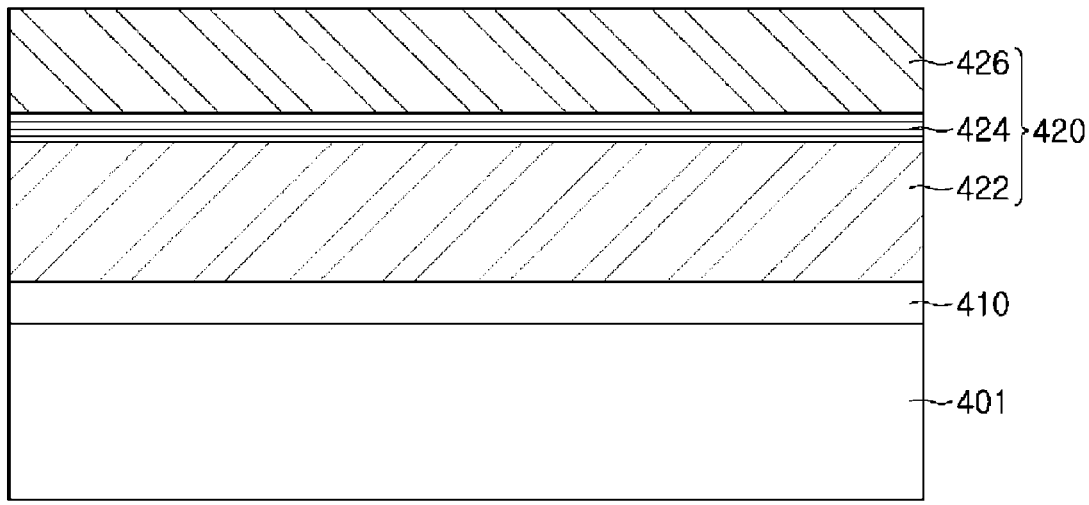
FIGS. 9A through 9F are cross-sectional views illustrating respective main processes in a method of manufacturing a semiconductor light emitting device according to an exemplary embodiment.

Referring to FIG. 9A, the buffer layer 410 may be first formed on the substrate 401. However, the buffer layer 410 may be omitted according to exemplary embodiments. As described above, the substrate 401 may be formed of sapphire, SiC, $MgAl_2O_4$, MgO, $LiAlO_2$, $LiGaO_2$, GaN, or the like, and the buffer layer 410 may be formed of undoped GaN, AlN, InGaN, or the like.

Then, the light emitting structure 420 including the first conductivity type semiconductor layer 422, the active layer 424, and the second conductivity type semiconductor layer 426, sequentially grown on the buffer layer 410 may be formed using a process such as metal organic chemical vapor deposition (MOCVD), hydride vapor phase epitaxy (HYPE), molecular beam epitaxy (MBE), or the like.

Figure 9B:
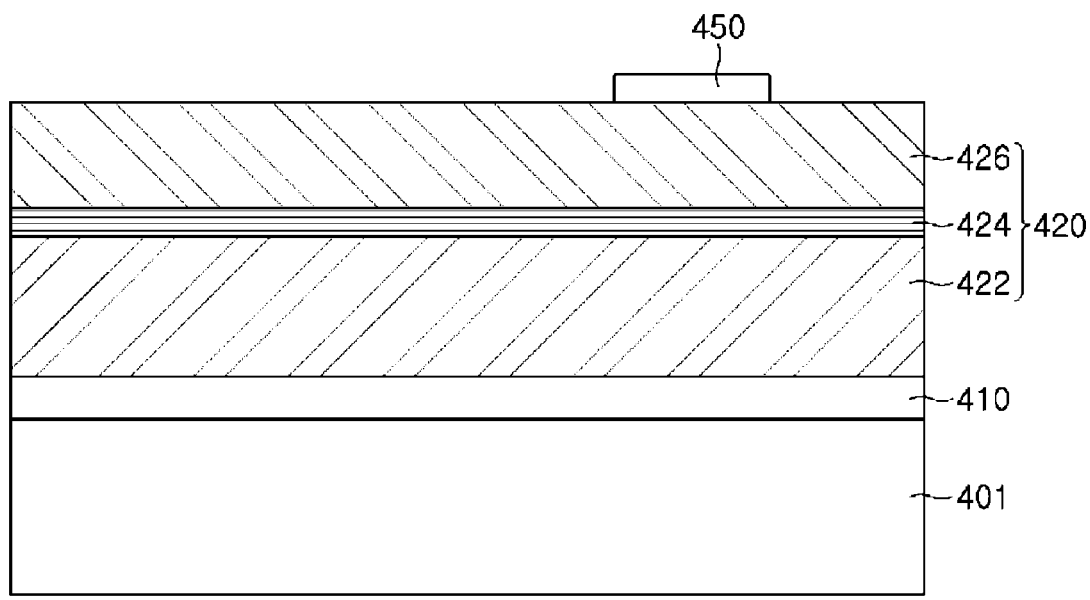

Referring to FIG. 9B, the current blocking layer 450 may be formed on a region of the second conductivity type semiconductor layer 426, on which the second reflective part 444 and the second bonding part 446 will be formed (refer to FIGS. 7 and 8). The current blocking layer 450 may be formed through a deposition process and a patterning process using a separate mask layer. The size of the current blocking layer 450 may be formed to be greater than the size of the opening OP of the transparent electrode part 442 illustrated in FIGS. 7 and 8.

Figure 9C:
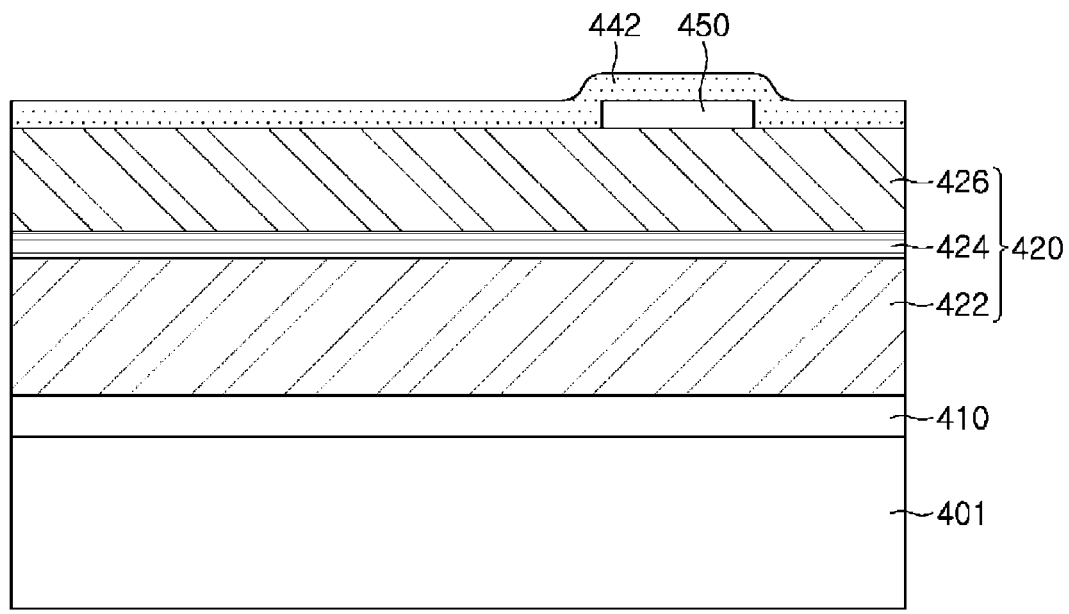

Referring to FIG. 9C, the transparent electrode part 442 may be formed on the current blocking layer 450 and the second conductivity type semiconductor layer 426. The transparent electrode part 442 may be formed of a transparent conductive material such as ITO, CIO, ZnO, or the like.

Figure 9D:
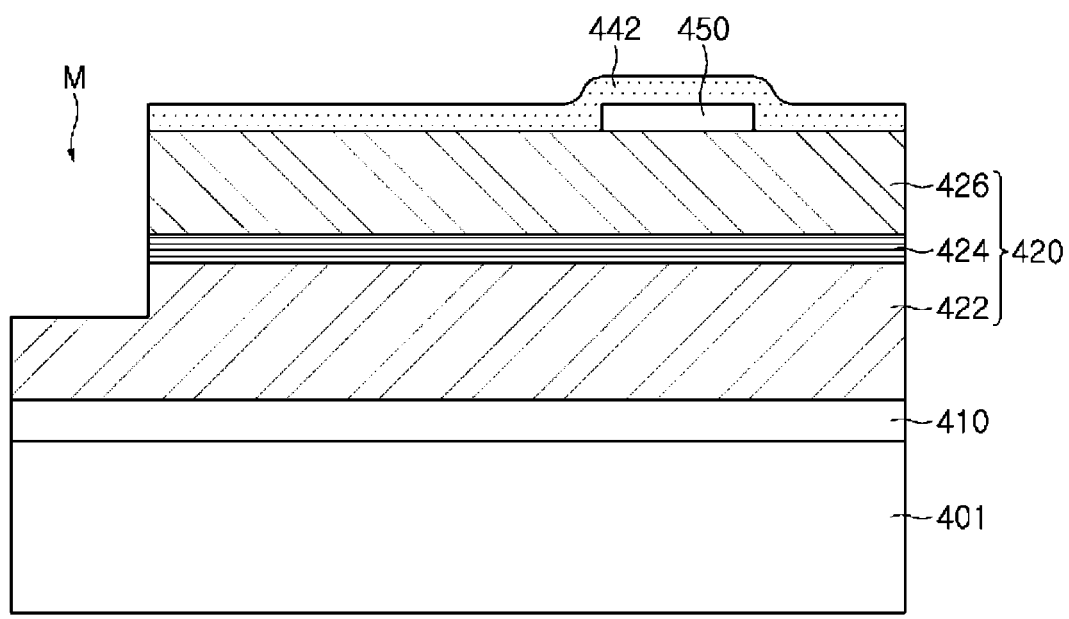

Referring to FIG. 9D, the transparent electrode part 442, the second conductivity type semiconductor layer 426, the active layer 424, and the first conductivity type semiconductor layer 422 may be partially etched in order to expose at least a portion of the first conductivity type semiconductor layer 422.

A surface of the first conductivity type semiconductor layer 422 exposed through an etching process is a region for forming the first electrode 430 (please refer to FIGS. 7 and 8). After a mask layer is formed on the first conductivity type semiconductor layer 422, except for the region for forming the first electrode 430, a mesa-etched region M may be formed through wet or dry etching. According to exemplary embodiments, an etching process may be performed such that only an upper surface of the first conductivity type semiconductor layer 422 may be partially exposed, rather than etching the first conductivity type semiconductor layer 422.

Figure 9E:
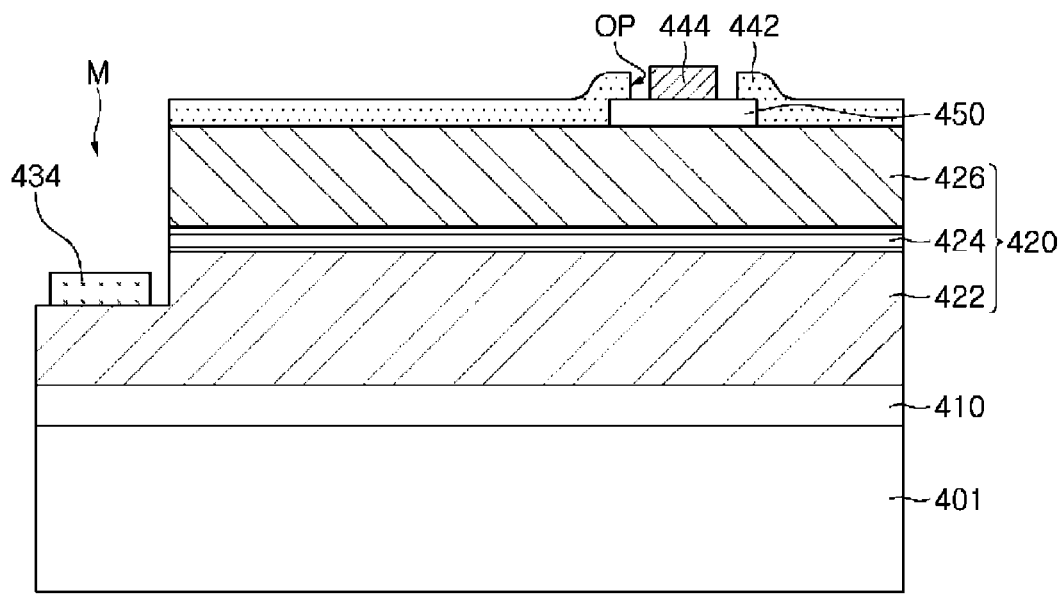

Referring to FIG. 9E, the opening OP is formed by removing a portion of the transparent electrode part 442, using a separate mask layer. The opening OP may be formed by, for example, wet etching. The opening OP may be formed on the current blocking layer 450 so as to be smaller than the current blocking layer 450, thereby exposing the current blocking layer 450. Thus, the current blocking layer 450 and the transparent electrode part 442 may be overlapped by a predetermined width in the circumference of the opening OP.

Then, a radio frequency (RF) plasma process may be performed. Through the RF plasma process, an oxidation layer may be formed on the exposed surface of the first conductivity type semiconductor layer 422, such that a difference in work functions between the first conductivity type semiconductor layer 422 and a first reflective part 434 may be reduced to increase current injection efficiency. For example, when the first conductivity type semiconductor layer 422 is formed of GaN and the first reflective part 434 includes Al, a $Ga_2O_3$ layer may be formed between the first conductivity type semiconductor layer 422 and the first reflective part 434 through the RF plasma process. However, the RF plasma process may be omitted according to exemplary embodiments.

Then, the first reflective part 434 and the second reflective part 444 may be formed. The first reflective part 434 may be formed on the surface of the first conductivity type semiconductor layer 422, exposed through the mesa-etched region M, and the second reflective part 444 may be formed on the current blocking layer 450 within the opening OP. The second reflective part 444 may be spaced apart from the transparent electrode part 442 by a predetermined distance. The first reflective part 434 and the second reflective part 444 may be formed of the same material through the same process, but may be formed of different materials through separate processes.

Figure 9F:
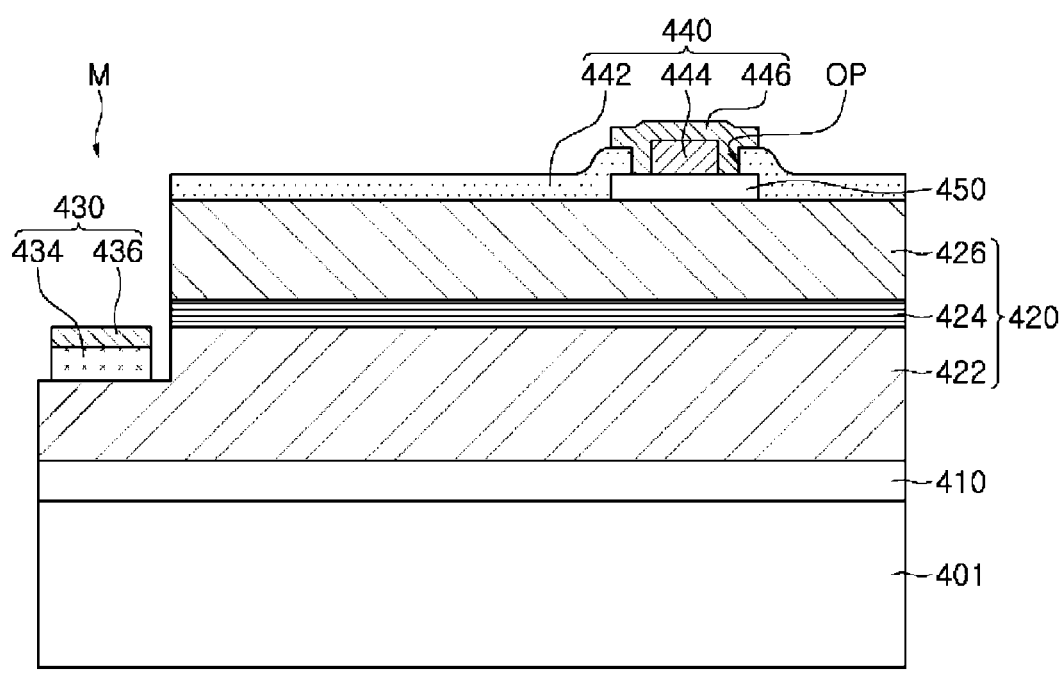

Referring to FIG. 9F, a first bonding part 436 and the second bonding part 446 may be formed. The first bonding part 436 may be formed on the first reflective part 434 in the mesa-etched region M, and the second bonding part 446 may be formed to cover the second reflective part 444 and overlap with a portion of the transparent electrode part 442.

The second bonding part 446 may be formed to fill the clearance between the transparent electrode part 442 and the second reflective part 444.

The first bonding part 436 and the second bonding part 446 may be formed of the same material through the same process, but may be formed of different materials through separate processes.

Figure 10:
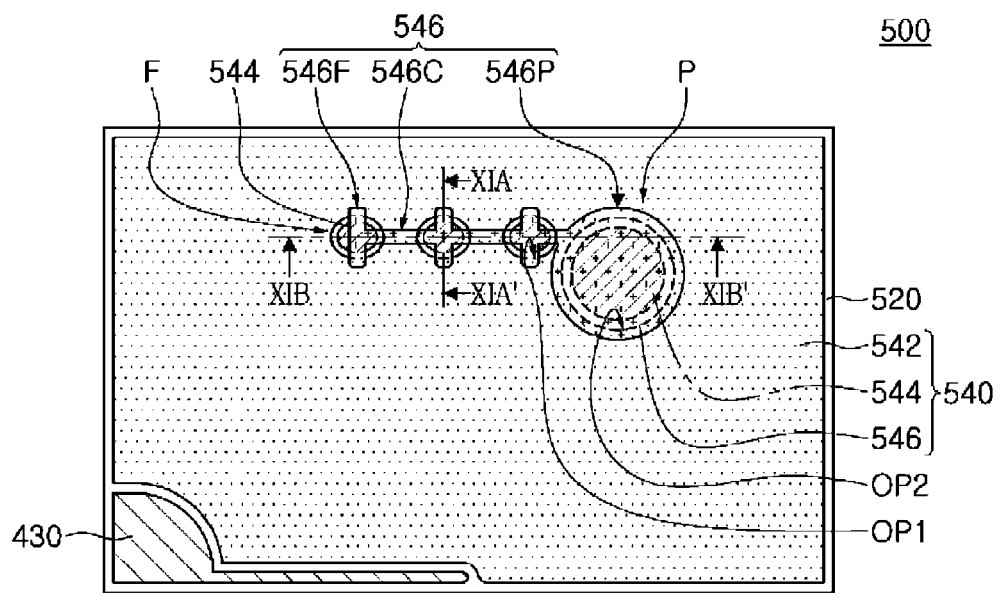
FIG. 10 is a schematic plan view of a semiconductor light emitting device according to an exemplary embodiment.
Figure 11:
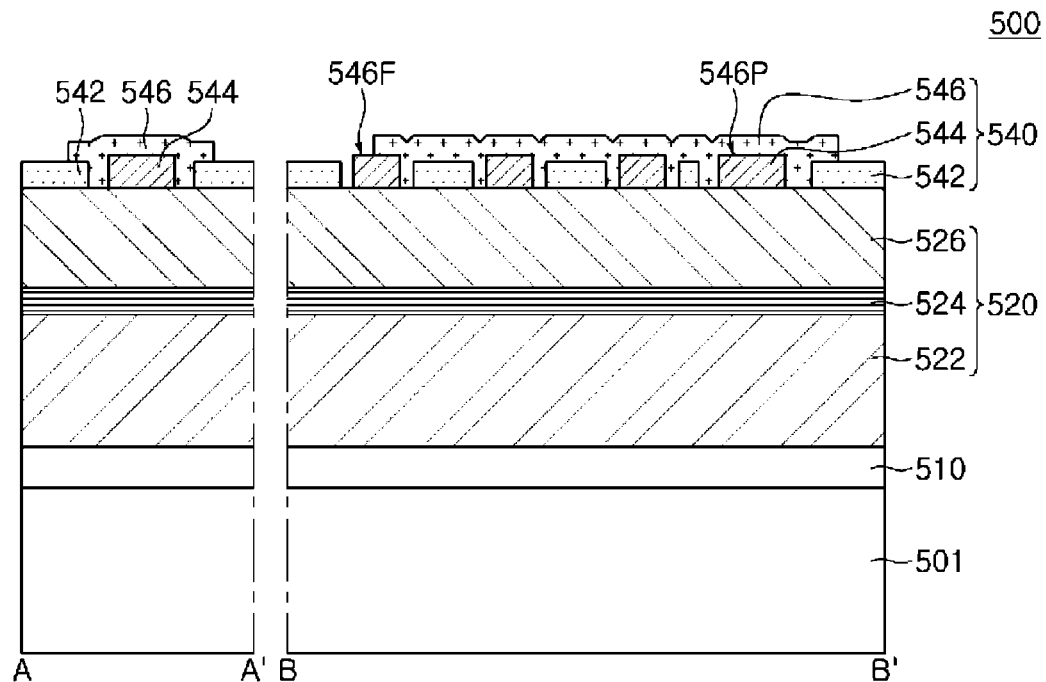
FIG. 11 is a schematic cross-sectional view of the semiconductor light emitting device of FIG. 10, taken along line XIA-XIA' and line XIB-XIB'.

FIG. 10 is a schematic plan view of a semiconductor light emitting device according to an exemplary embodiment. FIG. 11 is a schematic cross-sectional view of the semiconductor light emitting device of FIG. 10, taken along line XIA-XIA' and line XIB-XIB'.

Referring to FIGS. 10 and 11, a semiconductor light emitting device 500 may include a buffer layer 510 disposed on a substrate 501, and a light emitting structure 520 disposed on the buffer layer 510. The light emitting structure 520 may include a first conductivity type semiconductor layer 522, an active layer 524, and a second conductivity type semiconductor layer 526. In addition, the semiconductor light emitting device 500 may include first and second electrodes 530 and 540 as electrode structures.

The second electrode 540 may include a transparent electrode part 542 having first and second openings OP1 and OP2 formed therein, a second reflective part 544 spaced apart from the transparent electrode part 542 by a predetermined distance and disposed within the first and second openings OP1 and OP2, and a second bonding part 546 positioned on the second reflective part 544 or the transparent electrode part 542.

The transparent electrode part 542 may have a plurality of first openings OP1 and a single second opening OP2 formed therein, and the plurality of first openings OP1 may be arranged in a line while being spaced apart from each other by a predetermined distance in the finger region F and the single second opening OP2 may be disposed in the pad region P. The first and second openings OP1 and OP2 may have island shapes and the second opening OP2 may be greater than the first opening OP1. The shapes and the number of the plurality of first openings OP1 are limited to the exemplary embodiment illustrated in the drawings and may be variously changed.

The second reflective part 544 may have a shape similar to those of the first and second openings OP1 and OP2, and portions of the second reflective part 544 may have island shapes in which portions of the second reflective part 544 are spaced apart from each other within the first and second openings OP1 and OP2.

The second bonding part 546 may include a bonding pad part 546P, a plurality of bonding finger parts 546F and a connection part 546C.

The bonding pad part 546P may be extended onto the transparent electrode part 542 while covering the second reflective part 544 in the pad region P and filling a clearance between the second reflective part 544 and the transparent electrode part 542.

The plurality of bonding finger parts 546F may be arranged in a line while being spaced apart from each other by predetermined distances, in the finger region F. The number of the bonding finger parts 546F is not limited to the exemplary embodiment illustrated in the drawings and may be varied according to exemplary embodiments. The bonding finger parts 546F may be extended onto the transparent electrode part 542 while covering the second reflective part 544 and filling a clearance between the second reflective part 544 and the transparent electrode part 542, in the first openings OP1.

The connection part 546C may connect the bonding pad part 546P and the plurality of bonding finger parts 546F and may be disposed to pass through central portions of the bonding finger parts 546F from an end of the bonding pad part 546P.

The semiconductor light emitting device 500 according to the exemplary embodiment may include the plurality of bonding finger parts 546F having relatively small sizes and the area of the second reflective part 544 may be significantly reduced in the finger region F to thereby further increase light extraction efficiency. In addition, even in a region between the first openings OP1, the connection part 546C and the transparent electrode part 542 come into contact with each other to allow for the injection of current, thereby improving light uniformity.

Figure 12:
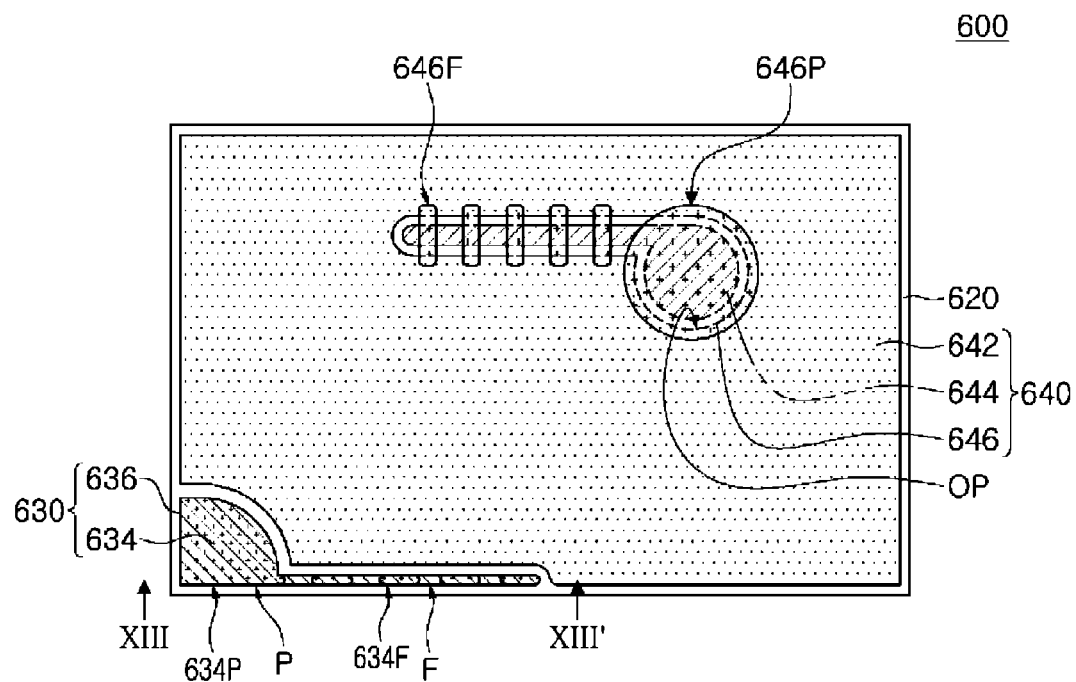
FIG. 12 is a schematic plan view of a semiconductor light emitting device according to an exemplary embodiment.
Figure 13:
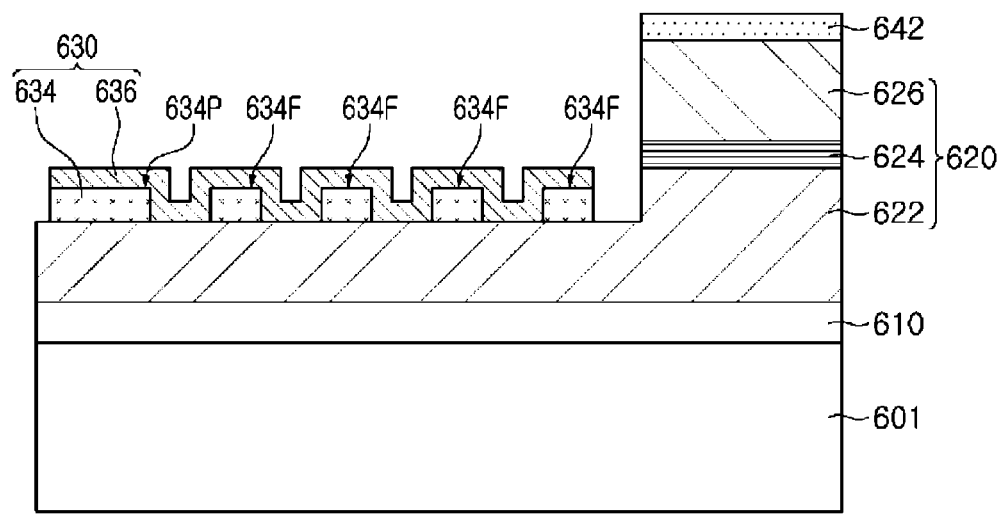
FIG. 13 is a schematic cross-sectional view of the semiconductor light emitting device of FIG. 12, taken along line XIII-XIII'.

FIG. 12 is a schematic plan view of a semiconductor light emitting device according to an exemplary embodiment. FIG. 13 is a schematic cross-sectional view of the semiconductor light emitting device of FIG. 12, taken along line XIII-XIII'.

Referring to FIGS. 12 and 13, a semiconductor light emitting device 600 may include a buffer layer 610 and a light emitting structure 620 disposed on a substrate 601, and the light emitting structure 620 may include a first conductivity type semiconductor layer 622, an active layer 624, and a second conductivity type semiconductor layer 626. In addition, the semiconductor light emitting device 600 may include first and second electrodes 630 and 640 as electrode structures.

The first electrode 630 may include a first reflective part 634 and a first bonding part 636. In the exemplary embodiment, the first electrode 630 may include the pad region P and the finger region F, and the first reflective part 634 may include a reflective pad part 634P and a plurality of reflective finger parts 634F. The plurality of reflective finger parts 634F may be arranged to be isolated from each other in the finger region F, in a direction which the reflective finger parts 634F are extended. That is, the plurality of reflective finger parts 634F may be spaced apart from each other by a predetermined distance.

The first bonding part 636 may be positioned on the first reflective part 634 and come into contact with the first conductivity type semiconductor layer 622, between the plurality of reflective finger parts 634F. Thus, in the semiconductor light emitting device 600 according to the exemplary embodiment, the injection of current from the first electrode 630 may be further efficiently performed. Moreover, in the manufacturing process above-described with reference to FIG. 9E, an RF plasma process may be omitted to allow for a simplified process.

Figure 14:
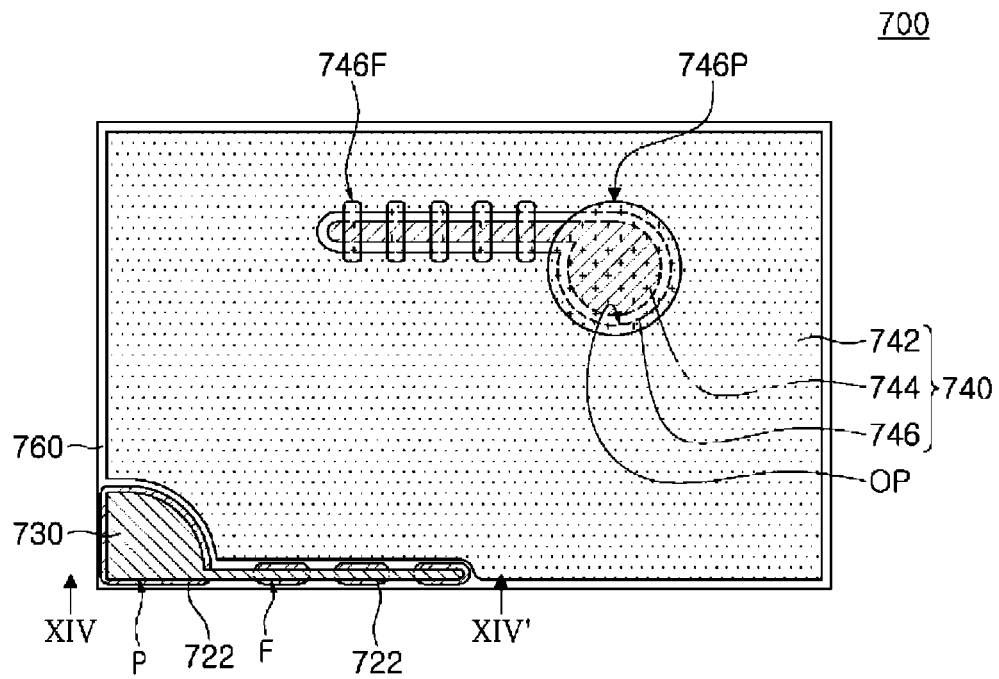
FIG. 14 is a schematic plan view of a semiconductor light emitting device according to an exemplary embodiment.
Figure 15:
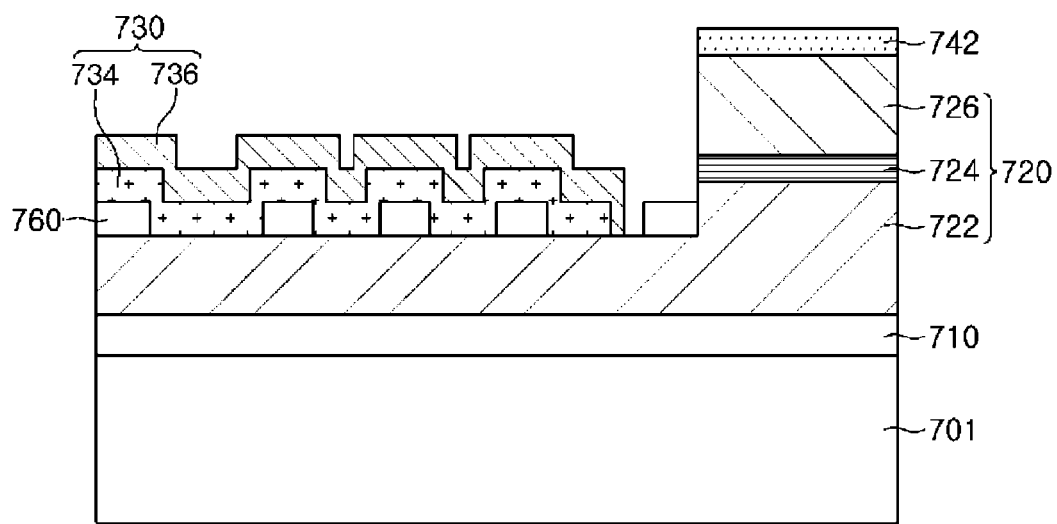
FIG. 15 is a schematic cross-sectional view of the semiconductor light emitting device of FIG. 14, taken along line XIV-XIV'.

FIG. 14 is a schematic plan view of a semiconductor light emitting device according to an exemplary embodiment. FIG. 15 is a schematic cross-sectional view of the semiconductor light emitting device of FIG. 14, taken along line XIV-XIV'.

Referring to FIGS. 14 and 15, a semiconductor light emitting device 700 may include a buffer layer 710 and a light emitting structure 720 disposed on a substrate 701, and the light emitting structure 720 may include a first conductivity type semiconductor layer 722, an active layer 724, and a second conductivity type semiconductor layer 726. In addition, the semiconductor light emitting device 700 may include first and second electrodes 730 and 740 as electrode structures. In particular, in the exemplary embodiment, the semiconductor light emitting device 700 may further include a light diffusion layer 760 disposed on the first conductivity type semiconductor layer 722 on which the first electrode 730 is disposed.

The first electrode 730 may include a first reflective part 734 and a first bonding part 736 and have the pad region P and the finger region F.

The light diffusion layer 760 may be disposed in predetermined regions of a lower portion of the first electrode 730, so as to expose the first conductivity type semiconductor layer 722. Specifically, the light diffusion layer 760 may expose the first conductivity type semiconductor layer 722 in the pad region P and expose the first conductivity type semiconductor layer 722 in predetermined regions of the finger region F, spaced apart from each other. Accordingly, the first reflective part 734 may only directly contact the exposed regions of the first conductivity type semiconductor layer 722.

The light diffusion layer 760 may include an insulating material, for example, at least one of $SiO_2$, SiN, $Al_2O_3$, HfO, $TiO_2$ and ZrO.

In the semiconductor light emitting device 700 according to the exemplary embodiment, the light diffusion layer 760 may be disposed on portions of the exposed upper surface of the first conductivity type semiconductor layer 722, it may prevent light emitted from the light emitting structure 720 from being totally reflected at an interface between the first electrode 730 and the first conductivity type semiconductor layer 722 to thereby improve luminance.

Figure 16:
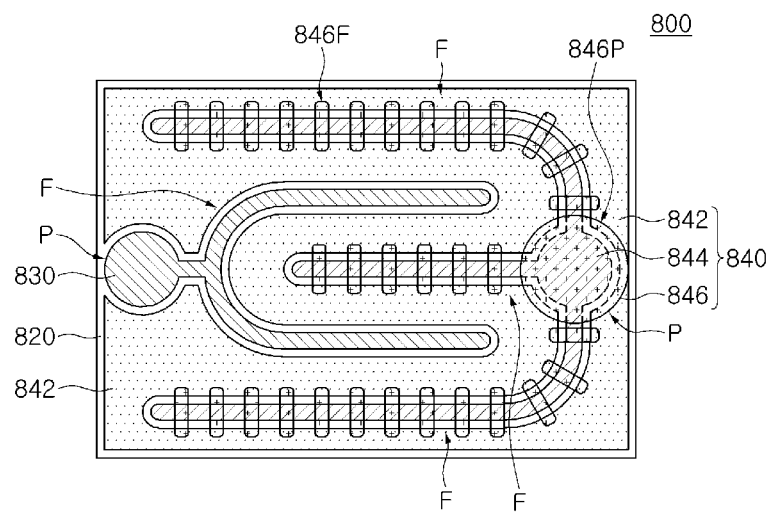
FIG. 16 is a schematic plan view of a semiconductor light emitting device according to an exemplary embodiment.
Figure 17:
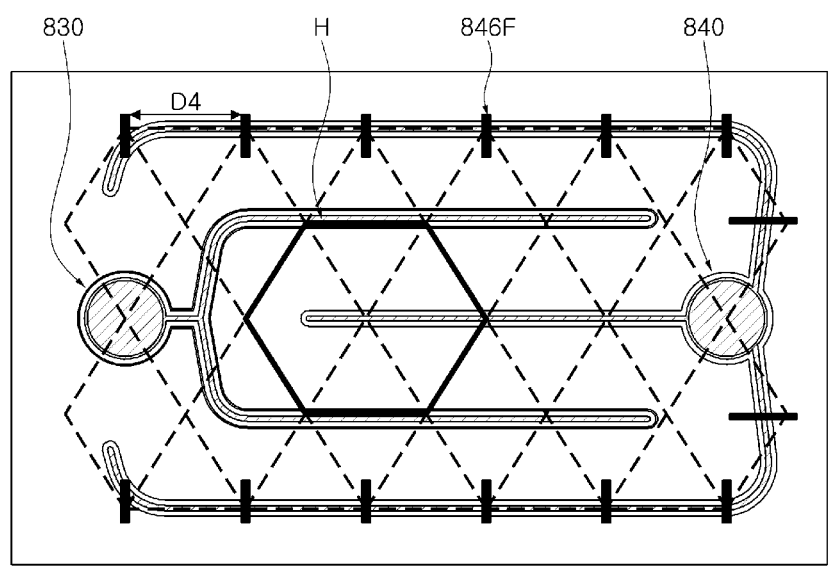
FIG. 17 is a view illustrating a method of disposing a second bonding part according to the exemplary embodiment.

FIG. 16 is a schematic plan view of a semiconductor light emitting device according to an exemplary embodiment. FIG. 17 is a view illustrating a method of disposing a second bonding part according to the exemplary embodiment.

Referring to FIG. 16, first and second electrodes 830 and 840 of a semiconductor light emitting device 800 may be disposed in the same direction, based on a substrate. In FIG. 16, some components of the semiconductor light emitting device 800 are not illustrated and with regard to a description thereof, the above description will be referred.

The first electrode 830 may be disposed on an upper surface of a first conductivity type semiconductor layer, exposed through the mesa-etched region of a light emitting structure 820, and the second electrode 840 may be disposed on a second conductivity type semiconductor layer positioned on an upper portion of the light emitting structure 820. The second electrode 840 may include a transparent electrode part 842, a second reflective part 844, and a second bonding part 846. The second bonding part 846 may include a bonding pad part 846P and a plurality of bonding finger parts 846F In the exemplary embodiment, the first electrode 830, and the second reflective part 844 and the second bonding part 846 of the second electrode 840 may respectively include pad regions P and a plurality of finger regions F extended from the pad regions P and having widths narrower than those of the pad regions P, in order to enable current to be uniformly injected into the entirety of the light emitting structure 820. As illustrated in FIG. 16, the first electrode 830 may include two finger regions F and the second reflective part 844 and the second bonding part 846 of the second electrode 840 may include three finger regions F. However, the number of the finger regions F of the first and second electrodes 830 and 840 is not limited to the exemplary embodiment illustrated in FIGS. 16 and 17, and may be variously changed according to exemplary embodiments. The finger regions F of the first electrode 830 and the finger regions F of the second reflective part 844 and the second bonding part 846 may be alternately disposed. Due to the dispositions of the first and second electrodes 830 and 840, current may efficiently flows within the light emitting structure 820 to increase light emission efficiency.

Referring to FIGS. 16 and 17, a method of disposing a plurality of bonding finger parts 846F is exemplified. A virtual current spreading net shown by dot lines on an upper surface of the light emitting structure 820 on which the second bonding part 846 is disposed, using a current spreading length depending on a given current value, may be illustrated in FIG. 17. A plurality of hexagonal regions H may be formed by the current spreading net and the plurality of bonding finger parts 846F may be disposed in vertices of the hexagonal regions H. However, in consideration of the disposition of the first electrode 830, the bonding finger parts 846F may not be disposed in a certain row and column of the hexagonal regions H. Further, in the finger region F of the second electrode 840 disposed in the middle of three finger regions F, the bonding finger parts 846F may be disposed in vertices of the hexagonal regions H, that is, points at which two lines intersect with each other.

In a single finger region F, the bonding finger parts 846F adjacent to each other may be spaced apart from each other by a distance D4, and the distance D4 may have the same value as that of the current spreading length.

According to the dispositions above described, the plurality of bonding finger parts 846F may be regularly arranged on the upper surface of the light emitting structure 820, such that current dispersion may be further efficiently performed.

Figure 18:
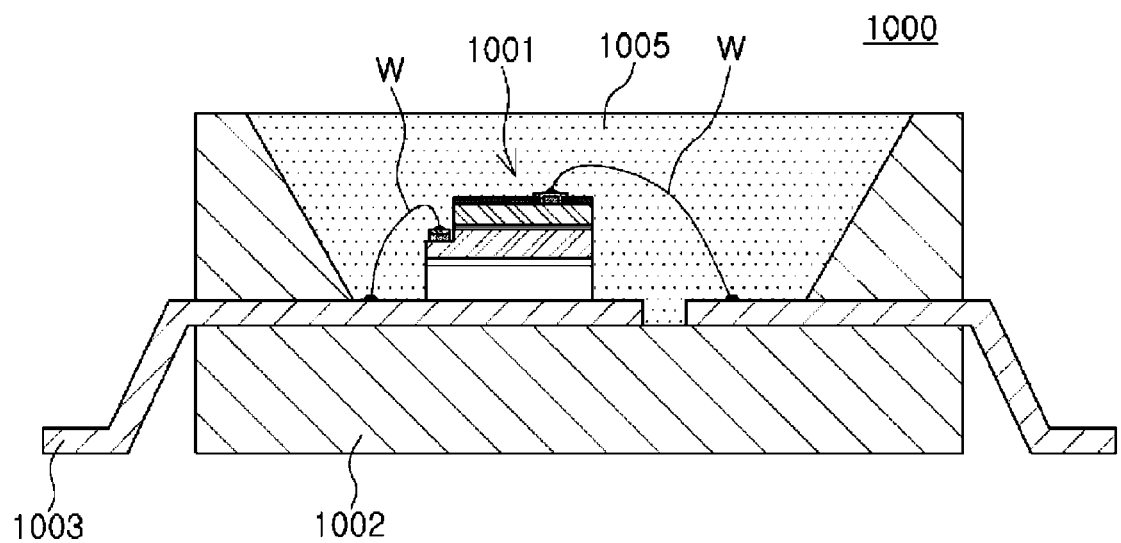
FIGS. 18 and 19 are views respectively illustrating an example of applying the semiconductor light emitting device according to the exemplary embodiment to a package.
Figure 19:
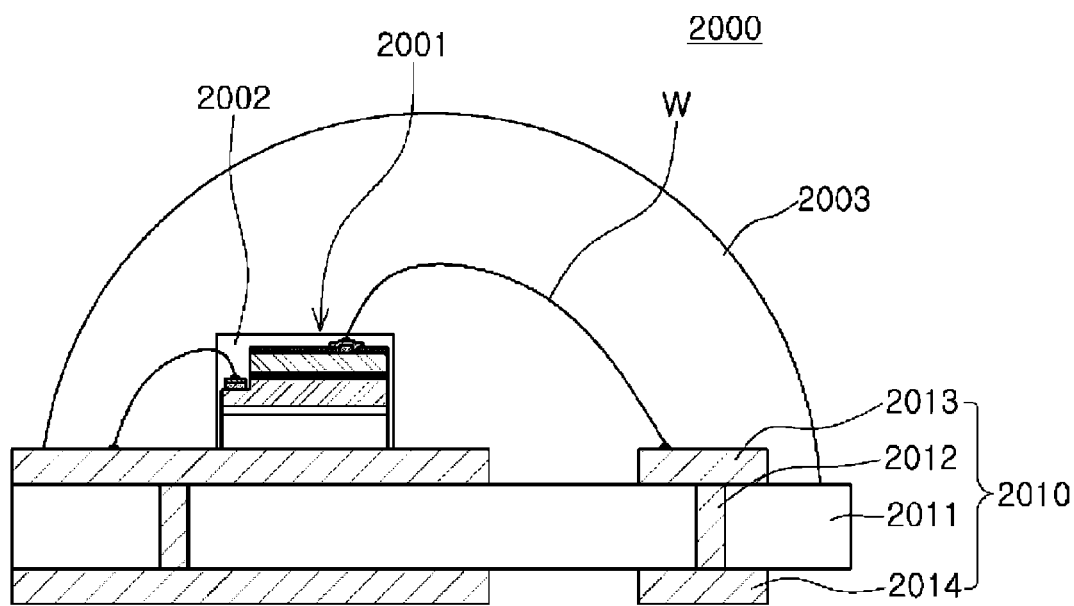

FIGS. 18 and 19 are views respectively illustrating an example of applying the semiconductor light emitting device according to the exemplary embodiment to a package.

Referring to FIG. 18, a semiconductor light emitting device package 1000 includes a semiconductor light emitting device 1001, a package main body 1002 and a pair of lead frames 1003. The semiconductor light emitting device 1001 may be mounted on the lead frame 1003 to be electrically connected thereto through a wire W. According to exemplary embodiments, the semiconductor light emitting device 1001 may be mounted on another portion of the package 1000 rather than the lead frame 1003, for example, on the package main body 1002. The package main body 1002 may have a cup shape in order to improve light reflection efficiency, and such a reflective cup may be filled with a sealing member 1005 including a light transmissive material in order to encapsulate the semiconductor light emitting device 1001 and the wire W. In the exemplary embodiment, the semiconductor light emitting device package 1000 may include any one of the semiconductor light emitting devices of FIGS. 1 to 8 or FIGS. 10 to 16.

Referring to FIG. 19, a semiconductor light emitting device package 2000 includes a semiconductor light emitting device 2001, a mounting board 2010 and a sealing member 2003. In addition, a wavelength conversion part 2002 may be formed on upper and side surfaces of the semiconductor light emitting device 2001. The semiconductor light emitting device 2001 may be mounted on the mounting board 2010 and electrically connected thereto through a wire W.

The mounting board 2010 may include a substrate main body 2011, an upper surface electrode 2013, and a lower surface electrode 2014. In addition, the mounting board 2010 may also include a through electrode 2012 connecting the upper surface electrode 2013 and the lower surface electrode 2014. The mounting board 2010 may be provided as a board such as PCB, MCPCB, MPCB, FPCB or the like and a structure thereof may be used in various manners.

The wavelength conversion part 2002 may include fluorescent materials or quantum dots. The sealing member 2003 may have a convex lens shape in which an upper surface thereof is upwardly convex, but may have a concave lens shape according to exemplary embodiments, whereby an orientation angle of light emitted through an upper surface of the sealing member 2003 may be controlled.

In the exemplary embodiment, the semiconductor light emitting device package 2000 may include any one of the semiconductor light emitting devices of FIGS. 1 to 8 or FIGS. 10 to 16.

Figure 20:
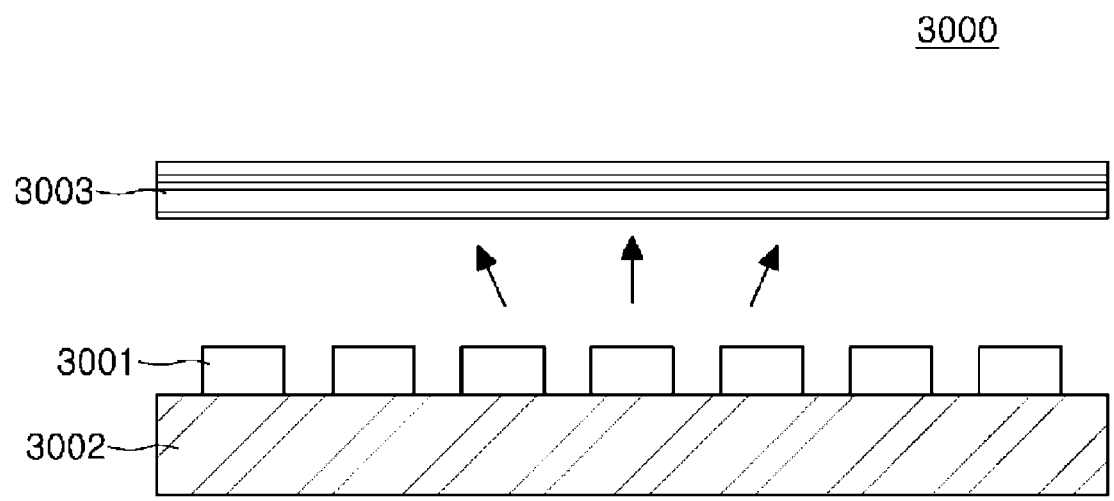
FIGS. 20 and 21 are views respectively illustrating an example of applying the semiconductor light emitting device according to the exemplary embodiment to a backlight part.
Figure 21:
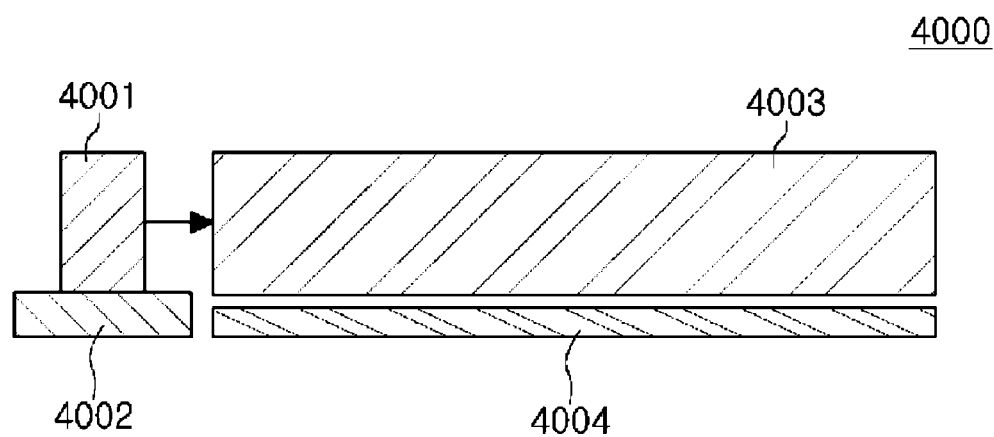

FIGS. 20 and 21 are views respectively illustrating an example of applying the semiconductor light emitting device according to the exemplary embodiment to a backlight part.

Referring to FIG. 20, a backlight unit 3000 includes a light source 3001 mounted on a substrate 3002 and at least one optical sheet 3003 disposed above the light source 3001. The light source 3001 may be a semiconductor light emitting device package having the structure above-described with reference to FIGS. 18 and 19 or a structure similar thereto. Alternatively, one of the semiconductor light emitting devices of FIGS. 1 to 8 or FIGS. 10 to 16 may be directly mounted on the substrate 3002 (so called a chip-on-board (COB) type).

The light source 3001 in the backlight unit 3000 of FIG. 20 emits light toward a liquid crystal display (LCD) device disposed the light source 3001. On the other hand, a light source 4001 mounted on a substrate 4002 in a backlight unit 4000 according to an exemplary embodiment illustrated in FIG. 21 emits light laterally and the emitted light is incident to a light guide plate 4003 such that the backlight unit 4000 may serve as a surface light source. The light that has passed through the light guide plate 4003 may be emitted upwardly and a reflective layer 4004 may be formed under a bottom surface of the light guide plate 4003 in order to improve light extraction efficiency.

Figure 22:
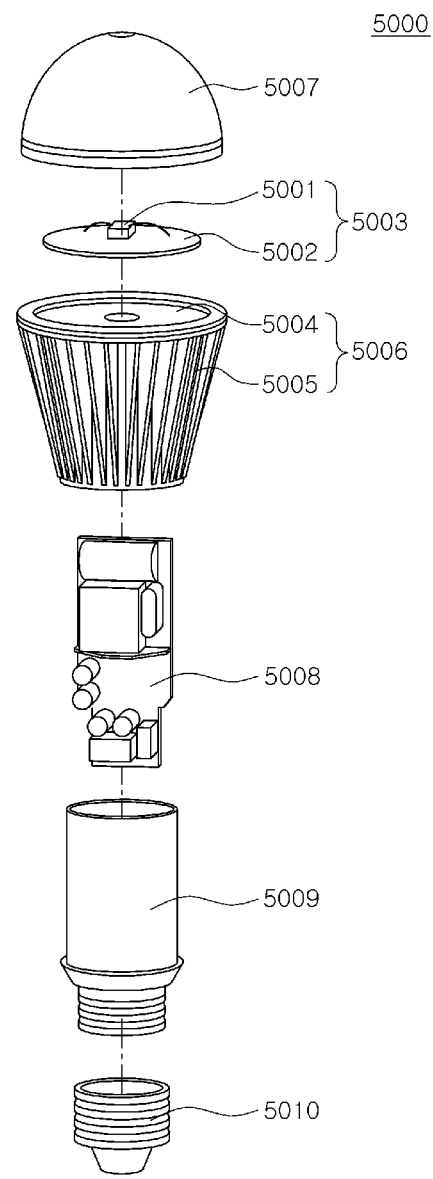
FIG. 22 is a view illustrating an example of applying the semiconductor light emitting device according to the exemplary embodiment to a lighting device.

FIG. 22 is a view illustrating an example of applying the semiconductor light emitting device according to the exemplary embodiment to a lighting device.

Referring to an exploded perspective view of FIG. 22, a lighting device 5000 is exemplified as a bulb-type lamp, and includes a light emitting module 5003, a driving unit 5008 and an external connector unit 5010. In addition, exterior structures such as an external housing 5006, an internal housing 5009, a cover unit 5007 and the like may be additionally included. The light emitting module 5003 may include a light source 5001 having the same structure as or a structure similar to that of the semiconductor light emitting device package above-described with reference to FIGS. 18 and 19 and a circuit board 5002 having the light source 5001 mounted thereon. The exemplary embodiment illustrates the case in which a single light source 5001 is mounted on the circuit board 5002; however, if necessary, a plurality of light sources may be mounted thereon.

The external housing 5006 may serve as a heat radiating part, and include a heat sink plate 5004 in direct contact with the light emitting module 5003 to improve the dissipation of heat and heat radiating fins 5005 covering a lateral surface of the lighting device 5000. The cover unit 5007 may be disposed above the light emitting module 5003 and may have a convex lens shape. The driving unit 5008 may be disposed inside the internal housing 5009 and may be connected to the external connector unit 5010 such as a socket structure to receive power from an external power source. In addition, the driving unit 5008 may convert the received power into a current source appropriate for driving the light source 5001 of the light emitting module 5003 and supply the converted current source thereto. For example, the driving unit 5008 may be provided as an AC-DC converter, a rectifying circuit part, or the like.

Further, the lighting device 5000 may further include a communication module.

Figure 23:
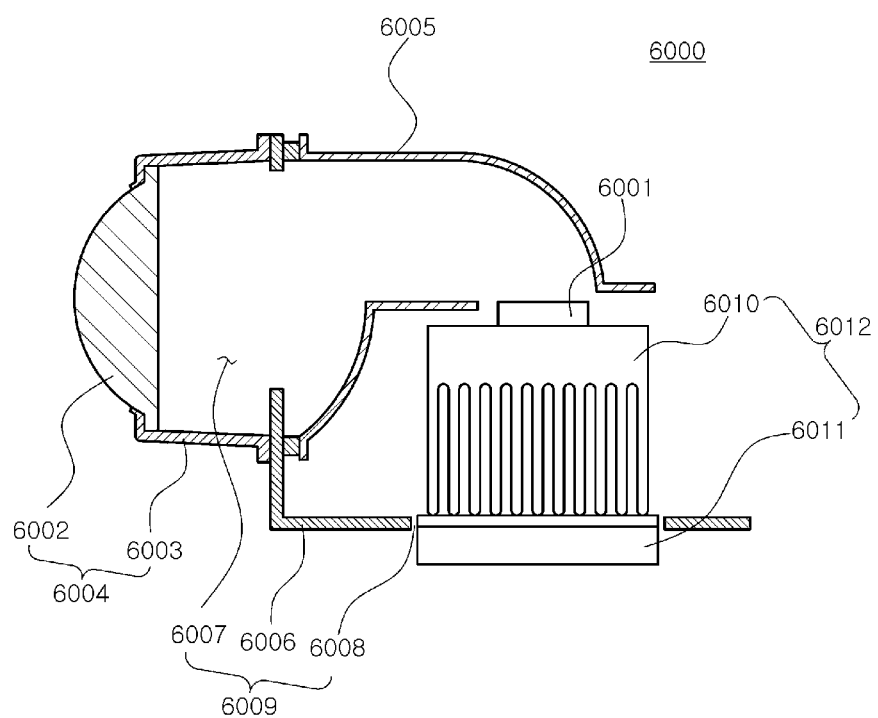
FIG. 23 is a view illustrating an example of applying the semiconductor light emitting device according to the exemplary embodiment to a headlamp.

FIG. 23 is a view illustrating an example of applying the semiconductor light emitting device according to the exemplary embodiment to a headlamp.

Referring to FIG. 23, a headlamp 6000 used as a vehicle lighting element or the like may include a light source 6001, a reflective unit 6005 and a lens cover unit 6004, the lens cover unit 6004 including a hollow guide part 6003 and a lens 6002. The light source 6001 may include at least one of the semiconductor light emitting device packages of FIGS. 18 and 19.

The head lamp 6000 may further include a heat radiating unit 6012 dissipating heat generated by the light source 6001 outwardly. The heat radiating unit 6012 may include a heat sink 6010 and a cooling fan 6011 in order to effectively dissipate heat. In addition, the headlamp 6000 may further include a housing 6009 allowing the heat radiating unit 6012 and the reflective unit 6005 to be fixed thereto and supported thereby. One surface of the housing 6009 may be provided with a central hole 6008 into which the heat radiating unit 6012 is inserted to be coupled thereto.

The other surface of the housing 6009 integrally connected to and bent in a direction perpendicular to one surface of the housing 6009 may be provided with a forward hole 6007 such that the reflective unit 6005 may be disposed above the light source 6001. Accordingly, a forward side may be opened by the reflective unit 6005 and the reflective unit 6005 may be fixed to the housing 1009 such that the opened forward side corresponds to the forward hole 6007, whereby light reflected by the reflective unit 6005 disposed above the light source 6001 may pass through the forward hole 6007 to be emitted outwardly.

As set forth above, according to the exemplary embodiments, a semiconductor light emitting device having improved luminance by significantly reducing light absorption and efficiently distributing current can be provided.

While exemplary embodiments has been shown and described, it will be apparent to those skilled in the art that modifications and variations can be made without departing from the spirit and scope of the inventive concept as defined by the appended claims.

What is claimed is:

1. A semiconductor light emitting device comprising:
   a light emitting structure comprising a first conductivity type semiconductor layer, an active layer disposed on the first conductivity type semiconductor layer, and a second conductivity type semiconductor layer disposed on the active layer;
   a first electrode disposed on the first conductivity type semiconductor layer; and
   a second electrode having a pad region and a finger region extending from the pad region, wherein the second electrode comprises:
   a transparent electrode part disposed on the second conductivity type semiconductor layer and having an opening provided in the pad region and the finger region;
   a reflective part disposed on the second conductivity type semiconductor layer in the opening of the transparent electrode part in the pad region and the finger region, and spaced apart from the transparent electrode part within the opening; and a bonding part comprising a plurality of bonding finger parts disposed on the reflective part in the finger region and spaced apart from each other, and a bonding pad part disposed on the reflective part in the pad region, wherein the bonding pad part covers the opening of the transparent electrode part in the pad region and extends onto the transparent electrode part, and the bonding pad part is interposed between the transparent electrode part and the reflective part within the opening of the transparent electrode part in the pad region.

2. The semiconductor light emitting device of claim 1, wherein the plurality of bonding finger parts extend across the opening of the transparent electrode part in the finger region and onto the transparent electrode part, and the plurality of bonding finger parts are interposed between the transparent electrode part and the reflective part within the opening in the finger region.

3. The semiconductor light emitting device of claim 1, wherein each bonding finger part of the plurality of bonding finger parts is spaced apart from an adjacent bonding finger part of the plurality of bonding finger parts by a predetermined distance.

4. The semiconductor light emitting device of claim 1, wherein the bonding part further comprises a connection part that extends from the bonding pad part and connects the bonding finger parts.

5. The semiconductor light emitting device of claim 1, wherein the bonding finger parts have a first width in a first direction in which the finger region is extended from the pad region, and a second width in a second direction perpendicular to the first direction, and wherein the second width is greater than the first width.

6. The semiconductor light emitting device of claim 5, wherein the bonding pad part has an area that is greater than an area of each of the bonding finger parts, and has a circular shape having a third width that is greater than the second width of the bonding finger parts.

7. The semiconductor light emitting device of claim 1, further comprising a current blocking layer interposed between the reflective part and the second conductivity type semiconductor layer within the opening in the pad region.

8. The semiconductor light emitting device of claim 1, wherein the first electrode comprises:

a first reflective part disposed on the first conductivity type semiconductor layer; and a first bonding part disposed on the first reflective part.

9. The semiconductor light emitting device of claim 1, wherein the first electrode has a first pad region and a first finger region extending from the first pad region, and the first electrode comprises:

a first reflective part disposed on the first conductivity type semiconductor layer, the first reflective part comprising a reflective pad part provided in the first pad region and a plurality of reflective finger parts provided in the first finger region and spaced apart from each other, and a first bonding part disposed on the first reflective part in the first pad region and the first finger region.

10. The semiconductor light emitting device of claim 9, wherein the first bonding part is disposed on the first conductivity type semiconductor layer between the plurality of reflective finger parts.

11. The semiconductor light emitting device of claim 1 further comprising a light diffusion layer disposed on the first conductivity type semiconductor layer and exposing portions the first conductivity type semiconductor layer, wherein the first electrode comprises:

a first reflective part disposed on the light diffusion layer and the exposed portions of the first conductivity type semiconductor layer; and a first bonding part disposed on the first reflective part.

12. The semiconductor light emitting device of claim 1, wherein the first electrode has a first pad region and a plurality of first finger regions extending from the first pad region, wherein the finger region of the second electrode comprises a plurality of second finger regions extending from the pad region of the second electrode, and the first finger regions of the first electrode and the second finger regions of the second electrode are alternately disposed to form a current spreading net.

* * * * *